(12) United States Patent
Singh et al.

(10) Patent No.: US 12,266,527 B1
(45) Date of Patent: Apr. 1, 2025

(54) DIRECTED SELF-ASSEMBLY ENABLED PATTERNING OVER METAL LAYERS USING ASSISTING FEATURES

(71) Applicant: Intel Corporation, Santa Clara, CA (US)

(72) Inventors: Gurpreet Singh, Portland, OR (US); Nityan Labros Nair, Portland, OR (US); Nafees A. Kabir, Portland, OR (US); Eungnak Han, Portland, OR (US); Xuanxuan Chen, Hillsboro, OR (US); Brandon Jay Holybee, Portland, OR (US); Charles Henry Wallace, Portland, OR (US); Paul A. Nyhus, Portland, OR (US); Manish Chandhok, Beaverton, OR (US); Florian Gstrein, Portland, OR (US); David Nathan Shykind, Buxton, OR (US); Thomas Christopher Hoff, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 529 days.

(21) Appl. No.: 17/559,406

(22) Filed: Dec. 22, 2021

(51) Int. Cl.
*H01L 21/027* (2006.01)

(52) U.S. Cl.
CPC ............... *H01L 21/0271* (2013.01)

(58) Field of Classification Search
CPC .................................... H01L 21/0271
See application file for complete search history.

(56) References Cited

U.S. PATENT DOCUMENTS

| 2013/0230981 A1* | 9/2013 | Kawamura | H01L 21/76816 257/E21.577 |
| 2017/0344694 A1* | 11/2017 | Guillorn | G06F 30/398 |
| 2019/0259656 A1* | 8/2019 | Nyhus | H01L 21/0337 |

* cited by examiner

*Primary Examiner* — Lex H Malsawma
*Assistant Examiner* — Bruce R. Smith
(74) *Attorney, Agent, or Firm* — Akona IP PC

(57) ABSTRACT

Described herein are IC devices include patterned conductive layers, such as metal gratings and gate layers, and patterned layers formed over the patterned conductive layers using a directed self-assembly (DSA)-enabled process with DSA assisting features. A patterned conductive layer may have non-uniform features, such as large regions of insulator within a metal grating, or varying gate lengths across a gate layer. The DSA assisting features enable the formation of patterned layers, e.g., layers with different hard mask materials replicating the structure of the conductive layer below, even over non-uniform features.

20 Claims, 30 Drawing Sheets

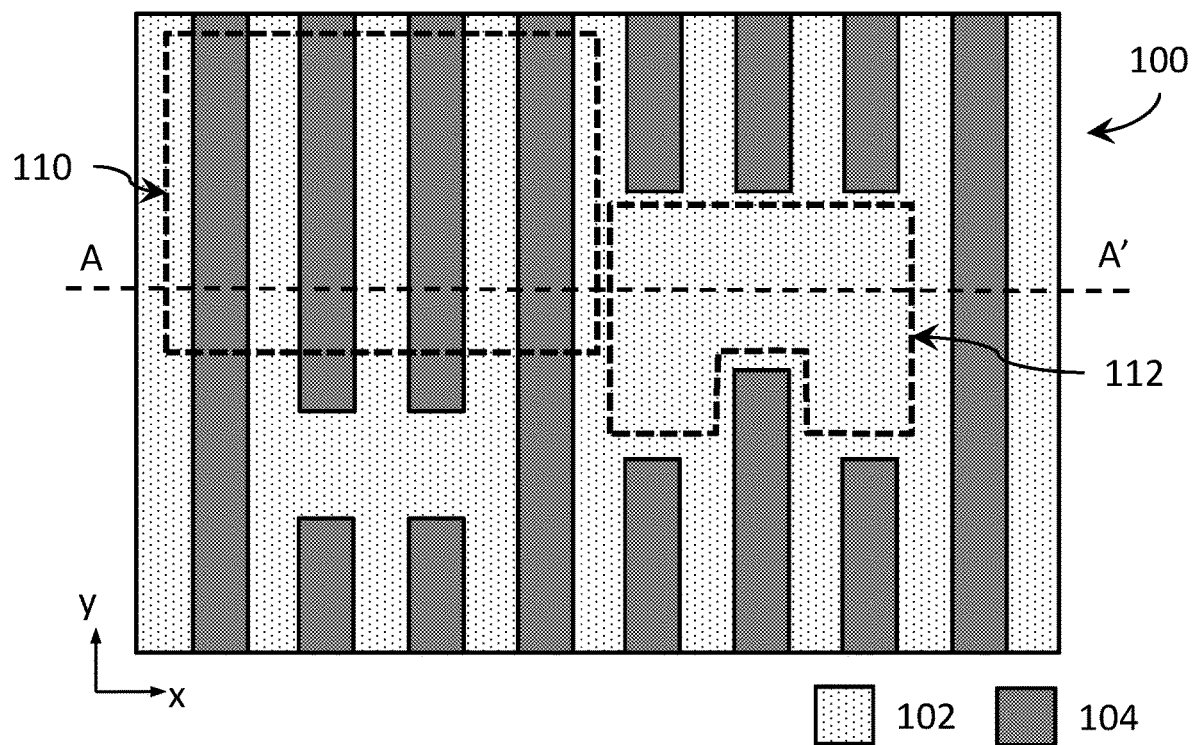
FIG. 1
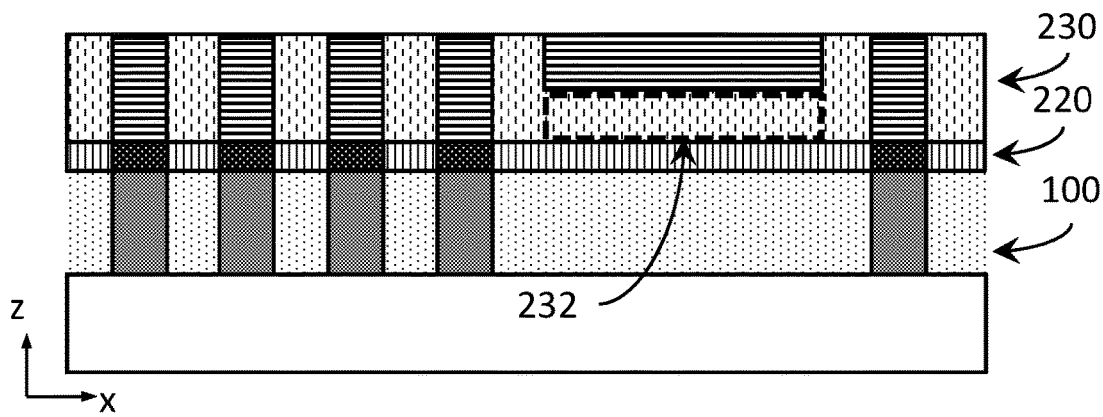
FIG. 2A
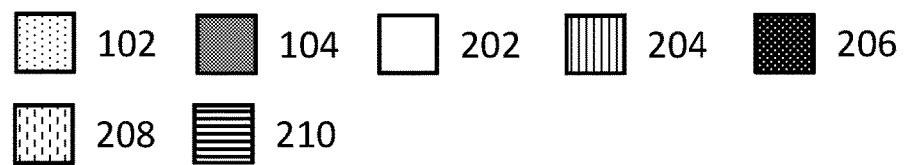

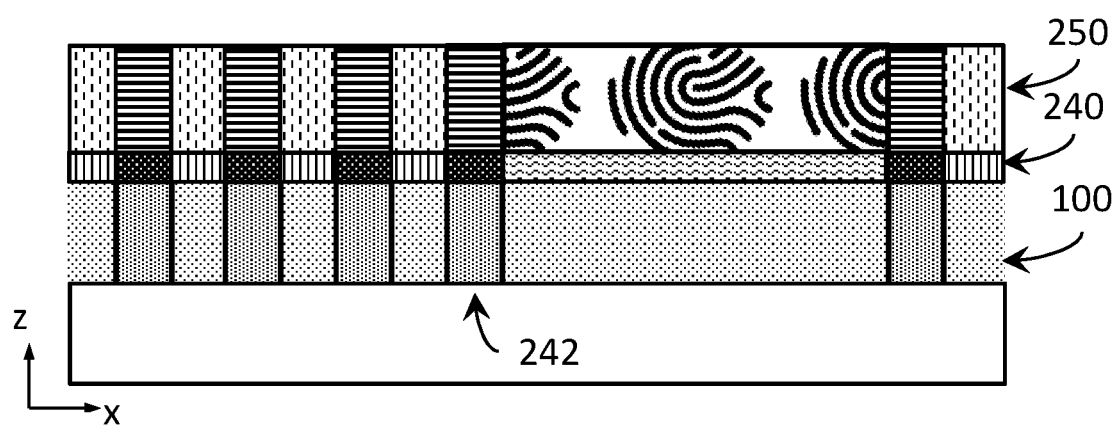
FIG. 2B
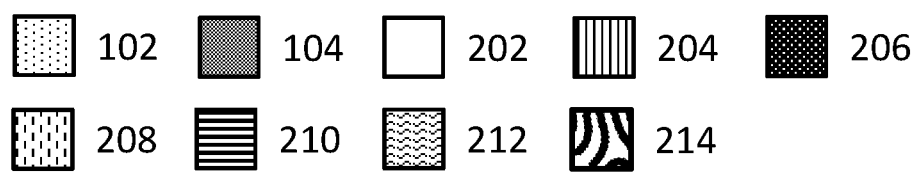

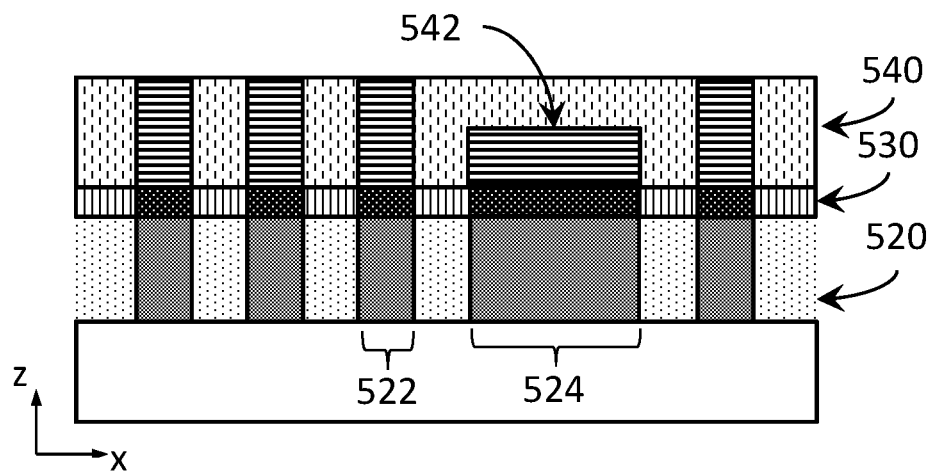
FIG. 5
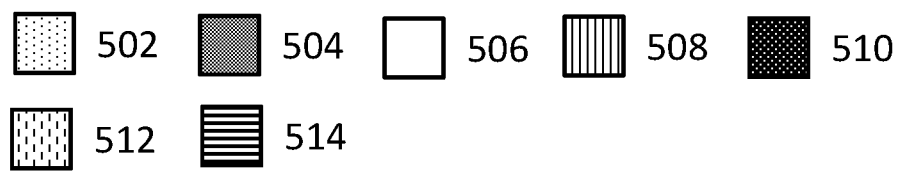

DIRECTED SELF-ASSEMBLY ENABLED PATTERNING OVER METAL LAYERS USING ASSISTING FEATURES

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for the ever-increasing capacity, however, is not without issue. The necessity to optimize the performance of each device and each interconnect becomes increasingly significant.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIG. 1 illustrates an example metal grating with non-uniform regions, according to some embodiments of the present disclosure.

FIGS. 2A and 2B illustrate example DSA errors that can occur when DSA is performed over the metal grating shown in FIG. 1.

FIG. 5 illustrates an example DSA error that can occur when DSA is performed over a gate layer with varying gate lengths.

DETAILED DESCRIPTION

Overview

Figure 3:
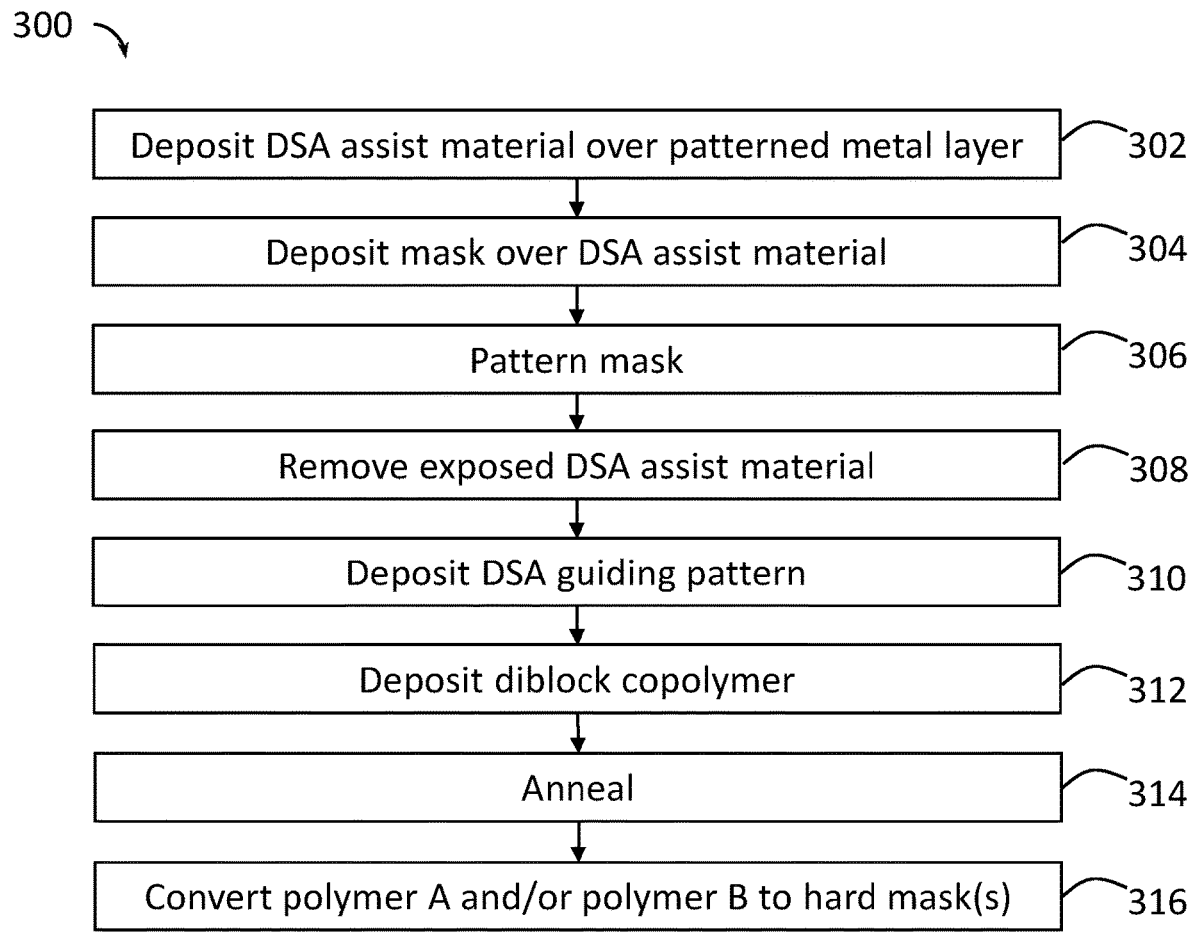
FIG. 3 is a flow chart illustrating a first process for generating a patterned layer over a metal grating using DSA assisting features, according to some embodiments of the present disclosure.

Integrated circuits commonly include electrically conductive microelectronic structures to electrically connect different portions of the circuits. Electrically conductive structures include metal lines, which are typically formed within a given layer (e.g., a metal layer); gates, which are typically formed within a gate layer; and vias, which connect to metal lines, gates, or other interconnects in layers above or below the vias. Metal structures are typically formed by a lithographic process. For example, a photoresist layer may be spin coated over a dielectric layer, the photoresist layer may be exposed to patterned actinic radiation through a patterned mask, and then the exposed layer may be developed to form openings (e.g., lines openings for metal lines or hole openings for vias) in the photoresist layer. Next, openings may be etched in the dielectric layer by using the opening in the photoresist layer as an etch mask. Finally, the openings may be filled with one or more metals or other conductive materials to form the electrically conductive structures.

In the past, the sizes and the spacing of electrically conductive structures has progressively decreased, and it is expected that in the future the sizes and the spacing of the structures will continue to progressively decrease, for at least some types of integrated circuits (e.g., advanced microprocessors, chipset components, graphics chips, etc.). One measure of the size of the electrically conductive structures is the critical dimension, e.g., a diameter or some other transverse cross-sectional dimension of the structure. Another measure of the spacing of the electronic structures is the pitch, representing the center-to-center distance between the closest adjacent structures.

When patterning extremely small structures with extremely small pitches by such lithographic processes, several challenges present themselves. One such challenge is that the overlay between adjacent layers, e.g., an overlay between a metal interconnect layer and a via layer, generally need to be controlled to high tolerances on the order of a quarter of the pitch. As pitches in microelectronic devices scale ever smaller over time, the overlay tolerances tend to scale with them at an even greater rate than lithographic equipment.

Another such challenge is that the critical dimensions of the openings generally tend to scale faster than the resolution capabilities of the lithographic scanners. Rectification technologies exist to reduce critical dimensions, however, the reduced amount tends to be limited by the minimum pitch, as well as by the ability of the opening rectification process to be sufficiently optical proximity correction (OPC) neutral, and to not significantly compromise line width roughness (LWR) and/or critical dimension uniformity (CDU). Yet another such challenge is that the LWR and/or CDU characteristics of photoresists generally need to improve as the critical dimensions of the openings decrease to maintain the same overall fraction of the critical dimension budget. However, currently the LWR and/or CDU characteristics of most photoresists are not improving as rapidly as the critical dimensions of the structures are decreasing.

A further such challenge is that the extremely small pitches generally tend to be below the resolution capabilities of even extreme ultraviolet (EUV) lithographic scanners. As a result, commonly two, three, or more different lithographic masks may be used, which tend to increase the costs. At some point, if pitches continue to decrease, it may not be possible, even with multiple masks, to print line and via openings at these extremely small pitches using EUV scanners. Even though EUV defined line and via openings offer a lot of design flexibility and helps save number of masks, EUV defined openings show a lot of variability in LWR and/or CDU due to stochastic nature of the process. The variability increases with decreasing critical dimensions. Additionally, the opening critical dimensions needed are beyond what EUV can do currently.

Directed self-assembly (DSA) enables the formation of patterns and structures with very low variability, providing a high degree of control at very small pitches, e.g., to generate structures with pitches below 30 nanometers or below 20 nanometers. DSA processes often rely on an existing pattern in an underlying layer. For example, given an incoming tight-pitch metal grating (e.g., a metal grating with a pitch of 30 nanometers or less), a guiding pattern can be formed over the metal grating. A diblock copolymer can be deposited over the guiding pattern to generate various linear structures or other types of patterns.

A diblock copolymer is a polymeric molecule formed of a chain of covalently bonded monomers. In a diblock copolymer, there are two different types of monomers, and these different types of monomers are primarily included within different blocks or contiguous sequences of monomers, e.g., a block of polymer A, and a block of polymer B. The two different monomers making up the diblock copolymer may have different chemical properties, e.g., polymer A may be relatively more hydrophobic, and polymer B may be relatively more hydrophilic. The diblock copolymer self-assembles based on the guiding pattern, with, e.g., polymer A forming over insulator portions of the metal grating, and polymer B forming over metal portions of the metal grating.

The two polymer blocks can be replaced with different materials, e.g., different insulating hard mask materials. This layer of alternating materials formed directly over the alternating metal and insulator portions of an underlying conductive layer improve the ability to land a via over a particular conductive area. For example, to etch a contact hole over a given metal line, a first hard mask material over the metal line is etched, but the etchant does not affect the second hard mask material on either side of the first hard mask material. The second hard mask material provides a buffer region that is not etched, which improves edge placement error (EPE) in via landing and reduces the likelihood of forming shorts when placing vias. Alternatively, one polymer block (e.g., the polymer block over the insulator portions of the metal grating) may be replaced by a hard mask, where the hard mask and/or remaining polymer can be selectively etched (e.g., the remaining polymer may be etched to form via holes without etching the hard mask).

Anchoring materials used to form a DSA guiding pattern often have an affinity for a particular underlying material (e.g., a metal or an insulator in a metal grating), or the anchoring materials react with a particular underlying material (the metal or insulator). If the structures in the underlying layer are uniform (e.g., the metal grating is uniform across the surface), anchoring materials in the guiding pattern can be formed in a uniform pattern across the metal grating. This uniform guiding pattern enables the diblock copolymer to form a consistent pattern over the guiding pattern.

However, for many IC designs, conductive layers do not have a uniform pattern. For example, while a metal layer may have some metal grating regions, the metal layer may also have some insulator regions in which the metal grating is not formed. For example, an insulator region of a metal layer may exist between breaks in a set of metal lines if a particular IC design has certain metal lines that are not continuous across the IC. These insulator regions can lead to defects in the DSA pattern formed over the metal grating, both in the region directly over the insulator region, and around an interface between the insulator region and an adjacent metal grating. As another example, a gate layer may have gates of varying gate lengths. If a DSA process is designed for the narrowest gate length, it may lead to defects over gates that are larger than the narrowest gate length. These types of non-uniform patterns within a conductive layer makes it difficult to form DSA patterned layers over the conductive layers.

As described herein, DSA assisting features are deposited in irregular or non-uniform regions of a conducting layer, such as a metal layer or a gate layer. The DSA assisting features enable a DSA process to form a consistent pattern over a conductive layer, and in particular, a conductive layer with non-uniform features, such as an insulator region within a metal grating, or a gate layer with multiple gate lengths. The DSA assisting features form one portion of a guiding pattern. Additional anchoring materials are deposited over other areas of the conducting layer. When a DSA process is performed over the guiding pattern, the DSA assisting features improve the assembly of polymer structures in the regions that include the DSA assisting features. This provides for better control over via placement and/or other structures formed over the conductive layer.

The systems, methods and devices of this disclosure each have several innovative aspects, no single one of which is solely responsible for all of the desirable attributes disclosed herein. Details of one or more implementations of the subject matter described in this specification are set forth in the description below and the accompanying drawings.

In the following detailed description, various aspects of the illustrative implementations may be described using terms commonly employed by those skilled in the art to convey the substance of their work to others skilled in the art. For example, the term "connected" means a direct electrical or magnetic connection between the things that are connected, without any intermediary devices, while the term "coupled" means either a direct electrical or magnetic connection between the things that are connected, or an indirect connection through one or more passive or active intermediary devices. The term "circuit" means one or more passive and/or active components that are arranged to cooperate with one another to provide a desired function. As used herein, a "logic state" (or, alternatively, a "state" or a "bit" value) of a memory cell may refer to one of a finite number of states that the cell can have, e.g., logic states "1" and "0," each state represented by a different voltage of the capacitor of the cell, while "READ" and "WRITE" memory access or operations refer to, respectively, determining/sensing a logic state of a memory cell and programming/setting a logic state of a memory cell. If used, the terms "oxide," "carbide," "nitride," etc. refer to compounds containing, respectively, oxygen, carbon, nitrogen, etc., the term "high-k dielectric" refers to a material having a higher dielectric constant (k) than silicon oxide, while the term "low-k dielectric" refers to a material having a lower k than silicon oxide. The terms "substantially," "close," "approximately," "near," and "about," generally refer to being within +/−20% of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description may use the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense. For convenience, if a collection of drawings designated with different letters are present, e.g., FIGS. 4A-4B, such a collection may be referred to herein without the letters, e.g., as "FIG. 4."

In the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Various IC devices with structures formed using the DSA processes described herein may be implemented in, or associated with, one or more components associated with an IC or/and may be implemented between various such components. In various embodiments, components associated with an IC include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer.

Example Non-Uniform Metal Grating Layer and Defects from a DSA Process

FIG. 1 illustrates an example metal grating with non-uniform regions, according to some embodiments of the present disclosure. FIG. 1 illustrates a top view of an example metal grating layer 100 that includes an insulator 102 and a metal 104. Some portions of the metal grating layer 100, such as the region 110, are uniform metal gratings that are compatible with DSA. Other portions of the metal grating layer 100, such as the region 112, are insulator regions that are not compatible with DSA. If a guiding pattern is applied to the metal grating layer 100 illustrated in FIG. 1, a first anchoring material may be deposited over the insulator 102, and a second anchoring material may be deposited over the metal 104. Thus, the region 112 is coated with the first anchoring material, which makes it difficult for a self-assembling diblock copolymer to assemble in its expected striped pattern over the region 112.

FIGS. 2A and 2B illustrate example DSA errors that can occur when DSA is performed over the metal grating layer 100 shown in FIG. 1. FIG. 2A includes a cross-section side view of the metal grating layer 100 shown in FIG. 1, with the cross-section taken along an x-z plane AA' of the reference coordinate system x-y-z used in the figures. FIG. 2A shows that the metal grating layer 100 is formed over a support structure 202. FIG. 2A further illustrates a guiding pattern 220 formed over the metal grating layer 100. The guiding pattern 220 includes a first anchoring material 204 deposited over the insulator 102, and a second anchoring material 206 deposited over the metal 104. A self-assembling polymer layer 230 is formed over the guiding pattern 220. The self-assembling polymer layer 230 includes regions of polymer A 208 and regions of polymer B 210.

In the region 110 (labelled in FIG. 1) with uniform metal gratings, lines of polymer A 208 form over the insulator 102 and the first anchoring material 204, and lines of polymer B 210 form over the metal 104 and the second anchoring material 206. The lines of the polymers 208 and 210 extend across the polymer layer 230 in the z-direction. The lines also extend across the polymer layer 230 in the y-direction (into the page), forming a striped pattern that aligns with the insulator 102 and metal 104 pattern in the region 110. However, around an interface between the region 112 and the surrounding area (e.g., including at a transition region between the regions 110 and 112), the lines of the polymers 208 and 210 over some portion of the metal grating may not assemble correctly, leading to defects over the metal grating.

Furthermore, in the region 112 (labelled in FIG. 1) without a metal grating, instead of extending in the z-direction, regions of polymer A 208 and polymer B 210 extend in the x-direction, i.e., the regions of polymer A 208 and polymer B 210 have a flipped morphology from the desired arrangement (i.e., the arrangement in the region 110). For example, polymer A 208 and polymer B 210 may form two sheets that extend in the x- and y-directions. The expanse of the first anchoring material 204 over the region 112 may have caused polymer A 208 to form as a sheet overtop of the first anchoring material 204 in the region 232, with polymer B 210 formed as a sheet over polymer A 208. After the DSA process is performed and the polymers are replaced with different materials, such as hard masks, the region 232 of polymer A 208 becomes trapped in the device. For example, if polymer A 208 is etched and replaced with a different material, the region of polymer B 210 formed over the region 232 prevents the polymer A 208 in the region 232 from being etched. Alternatively, if polymer B 210 is etched and replaced before polymer A 208, the material replacing polymer B 210 is deposited over the region 232, again preventing the polymer A 208 in the region 232 from being etched. During further processing of the IC device, the region 232 of trapped polymer A 208 can outgas and lead to de-lamination in the IC device and/or may contaminate the chamber in which the device is being processed. Even if the trapped region 232 is removed, defects in the transition region surrounding the region 112 and extending into the metal grating where the polymers 208 and 210 did not properly assemble cannot be removed, leading to defects in the resulting hard mask.

Figure 12:
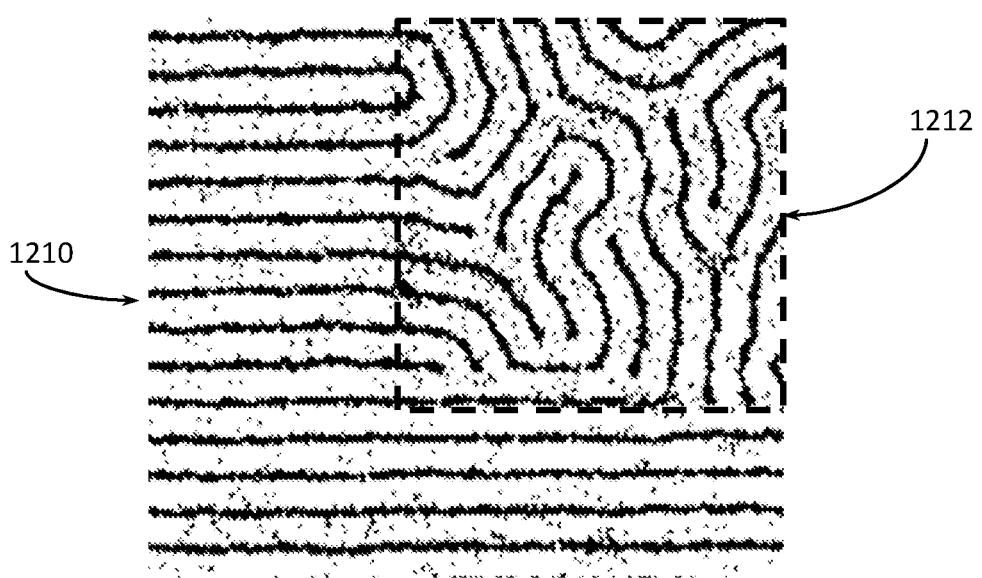
FIG. 12 illustrates a portion of a patterned layer generated using any of the processes described herein, according to some embodiments of the present disclosure.

FIG. 2B illustrates a second type of DSA error that can occur when DSA is performed over the metal grating layer 100 shown in FIG. 1. FIG. 2B includes a cross-section side view of the metal grating layer 100 shown in FIG. 1, with the cross-section taken along an x-z plane AA' of the reference coordinate system x-y-z used in the figures. Like FIG. 2A, FIG. 2B shows that the metal grating layer 100 is formed over a support structure 202. FIG. 2B includes a second example guiding pattern 240 formed over the metal grating layer 100. The guiding pattern 240 includes the first anchoring material 204 deposited over portions of the insulator 102 and a second anchoring material 206 deposited over the metal 104. The guiding pattern 240 further includes a neutral material 212 deposited in the region 112. A self-assembling polymer layer 250 is formed over the guiding pattern 240. The self-assembling polymer layer 230 includes regions of polymer A 208, regions of polymer B 210, as well as regions where the polymers form a fingerprint pattern 214. The fingerprint pattern 214 is a pattern of alternating regions of polymer A 208 and polymer B 210 that exhibits a higher degree of irregularity and lack of directionality across the pattern. A fingerprint pattern may resemble types of physical structures observed in humans' fingerprints. The pattern used to represent the fingerprint pattern 214 in FIG. 2B symbolic; an example top view of a fingerprint pattern is illustrated in FIG. 12.

In much of the region 110 (labelled in FIG. 1) with uniform metal gratings, polymer A 208 forms over the insulator 102 and the first anchoring material 204, and polymer B 210 forms over the metal 104 and the second anchoring material 206. The fingerprint pattern 214 forms over the neutral material 212 in the guiding pattern 240. If the fingerprint pattern 214 is formed in an inactive region of an IC device, the irregular pattern in that region itself may not cause problems for the device. However, in some cases, the fingerprint pattern 214 extends into and, in some cases, extends beyond an interface or transition between an inactive region and an active region, and thus can impact the proper formation of the pattern over an active region, such as over a metal line in the metal grating layer 100. This can make it difficult to form vias or other structures over the metal line 242.

Example Process for Generating a Patterned Layer Over a Metal Grating Using DSA-Assisting Features FIG. 3 is a flow chart illustrating a first process 300 for generating a patterned layer over a metal grating using DSA assisting features, according to some embodiments of the present disclosure. The process 300 may be used to generate a patterned layer with a high degree of uniformity over a non-uniform metal grating layer. For example, the metal grating layer may have regions of insulator, e.g., between non-continuous metal lines. The patterned layer also has a high degree of precision at tight pitches, e.g., at pitches less than 30 nanometers.

FIGS. 4A-4I illustrate various stages in the process of generating the patterned layer according to the process of FIG. 3, according to some embodiments of the present disclosure. More specifically, FIGS. 4A-4I illustrate top-down and cross-sectional side views for various stages in the process of generating the patterned layer according to the process 300. In particular, each of FIGS. 4A-4I shows, at the top of the page of the drawing, a top-down view (i.e., a view in a x-y plane) of an IC structure, and at the bottom of the drawing, a cross-section side view of the IC structure with the cross-section taken along an x-z plane AA' of the reference coordinate system x-y-z shown in FIGS. 4A-4I.

A number of elements referred to in the description of FIGS. 4A-4I with reference numerals are illustrated in these figures with different patterns, with a legend showing the correspondence between the reference numerals and patterns being provided at the bottom of each drawing page containing FIGS. 4A-4I. For example, the legend illustrates that FIGS. 4A-4I use different patterns to show an insulator 402 and a metal 404. Furthermore, although certain example metal grating patterns are illustrated in some of 4A-4I, this is simply for ease of illustration, and it should be understood that different IC structures having different metal patterns may be obtained according to the disclosure. Still further, various IC structure views shown in FIGS. 4A-4I are intended to show relative arrangements of various elements therein, and that various IC structures, or portions thereof, may include other elements or components that are not illustrated (e.g., transistor portions, various components that may be in electrical contact with the capacitor or contacts, etc.).

Figure 4A:
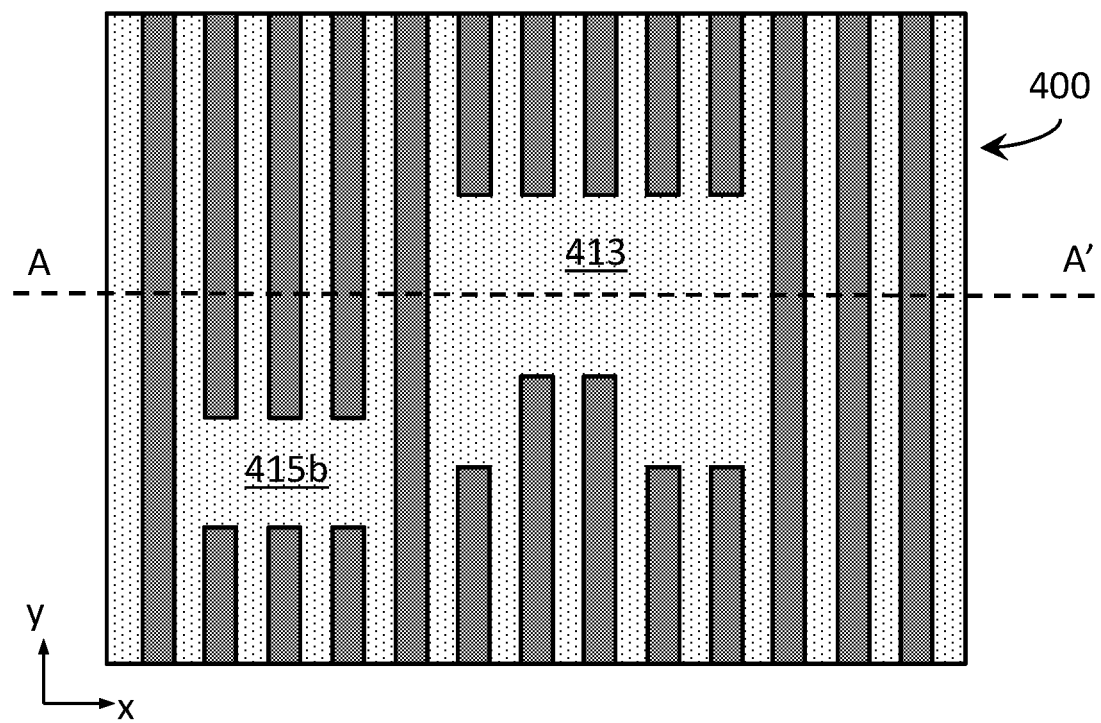
FIGS. 4A-4I illustrate various stages in the process of generating the patterned layer according to the process of FIG. 3, according to some embodiments of the present disclosure.
Figure 4A:
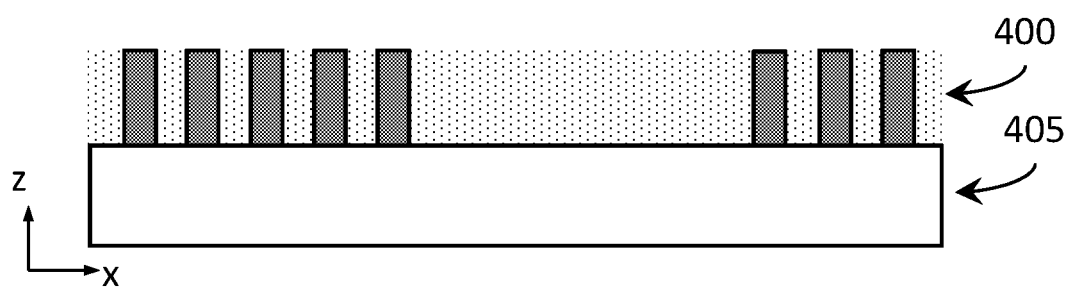
Figure 4A:

FIG. 4A illustrates an example of a metal grating layer 400 including an insulator 402 and a metal 404. The metal grating layer 400 is formed over a support structure 405. In general, implementations of the disclosure may be formed or carried out on a substrate, such as a semiconductor substrate composed of semiconductor material systems including, for example, N-type or P-type materials systems. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V, group II-VI, or group IV materials. Although a few examples of materials from which the substrate may be formed are described here, any material that may serve as a foundation upon which an IC may be built falls within the spirit and scope of the present disclosure. In various embodiments, the support structure 405 may include any such substrate, possibly with some layers and/or devices, e.g., the metal grating layer 400, already formed thereon, providing a suitable surface for forming the metal contacts as described herein.

The insulator 402 may include any insulating medium, such as an interlayer dielectric (ILD). The insulator 402 may include any suitable ILD materials such as silicon oxide, carbon-doped silicon oxide, silicon carbide, silicon nitride, aluminum oxide, and/or silicon oxynitride.

The metal 404 may include one or more of any metal or other suitable electrically conductive materials (conductors). While the metal 404 is referred to generally as a metal, it should be understood that various mixtures of metals and non-metals, or other types of conducting materials, may be used instead of a metal. Such conductive materials may include any suitable electrically conductive material, alloy, or a stack of multiple electrically conductive materials. In some embodiments, the metal 404 may include one or more metals or metal alloys, with metals such as copper, ruthenium, palladium, platinum, cobalt, nickel, hafnium, zirconium, titanium, tantalum, and aluminum. In some embodiments, the metal 404 may include one or more electrically conductive alloys, oxides (e.g., conductive metal oxides), carbides (e.g., hafnium carbide, zirconium carbide, titanium carbide, tantalum carbide, and aluminum carbide, tungsten, tungsten carbide), or nitrides (e.g., hafnium nitride, zirconium nitride, titanium nitride, tantalum nitride, and aluminum nitride) of one or more metals.

The metal grating layer 400 includes two example insulator regions 413 and 415 that do not include lines of the metal 404. These insulator regions 413 and 415 may not ordinarily be compatible with a DSA process, as described with respect to the insulator region 112 of FIG. 1.

Figure 4B:
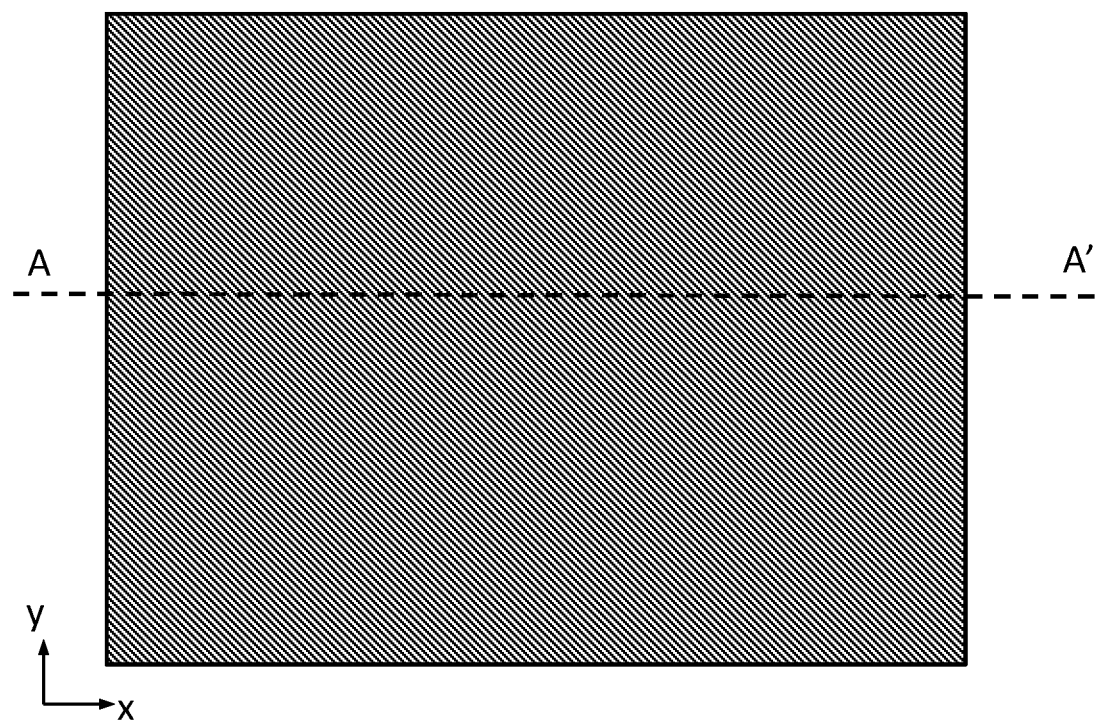
Figure 4B:
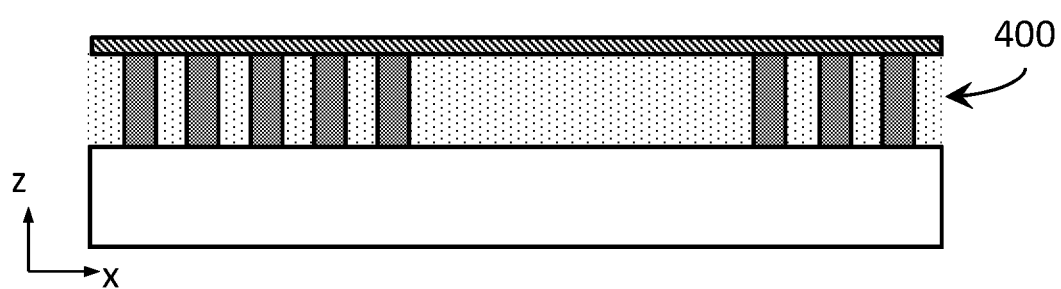
Figure 4B:

Turning to FIG. 3, the process 300 may begin with depositing 302 a DSA assist material over a pattered metal layer. FIG. 4B illustrates an example of a DSA assist material 406 deposited over the metal grating layer 400 shown in FIG. 4A. The DSA assist material 406 is a material that can serve as part of a guiding pattern to direct the self-assembly of a block polymer. For example, the DSA assist material 406 may have a chemical affinity one of the polymers (e.g., polymer B 418, as described further below) in a block polymer deposited over the DSA assist material 406, or may be a material that can be chemically modified to be affinitive to one of the polymers. For example, the DSA assist material 406 may be a cross-linking polystyrene (X-PS), cross-linking poly methyl methacrylate (X-PMMA), or aluminum oxide.

Figure 4C:
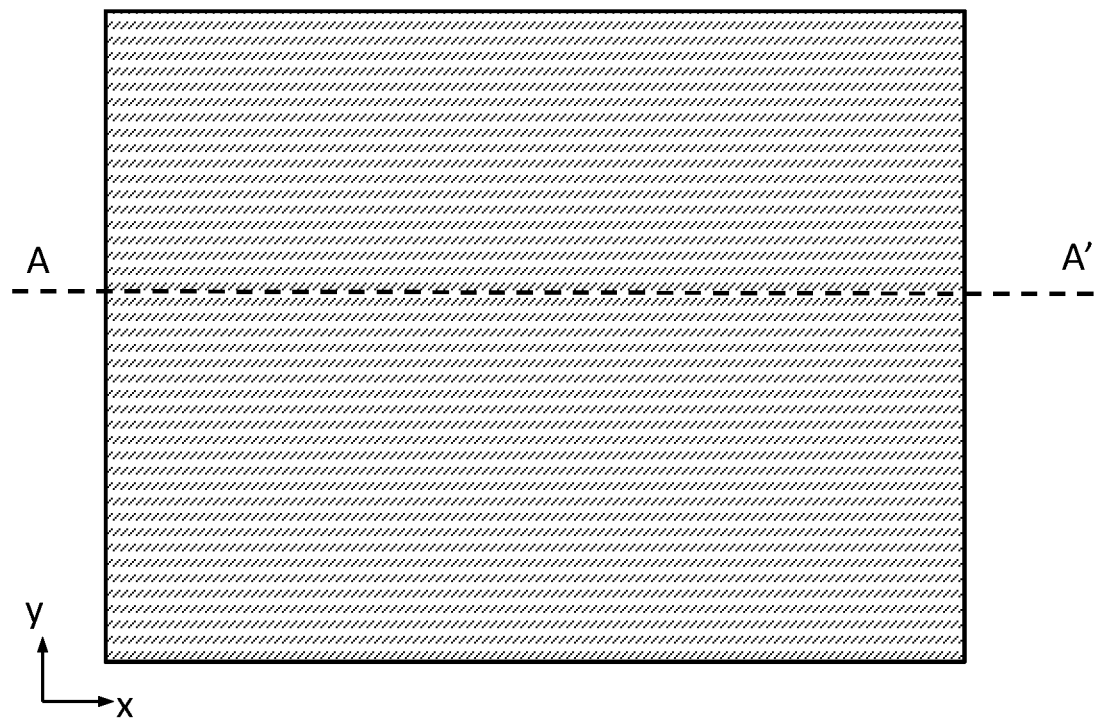
Figure 4C:
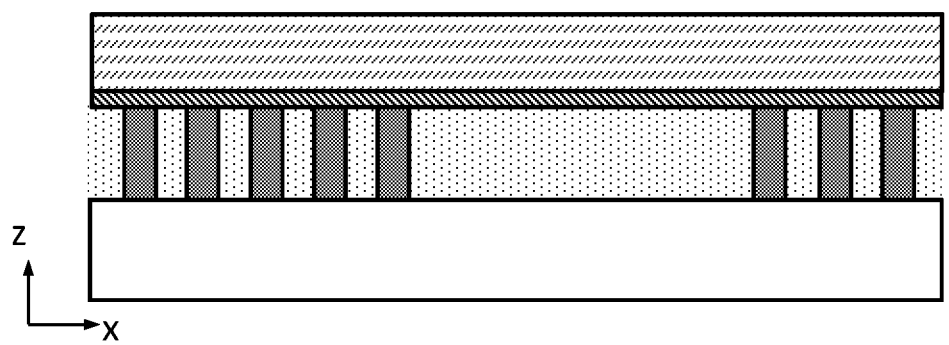
Figure 4C:

The process 300 proceeds with depositing 304 a mask over the DSA assist material. FIG. 4C illustrates an example of mask 408 deposited over the DSA assist material 406. The mask 408 may include any dielectric hard mask material or another mask material known in the art.

Figure 4D:
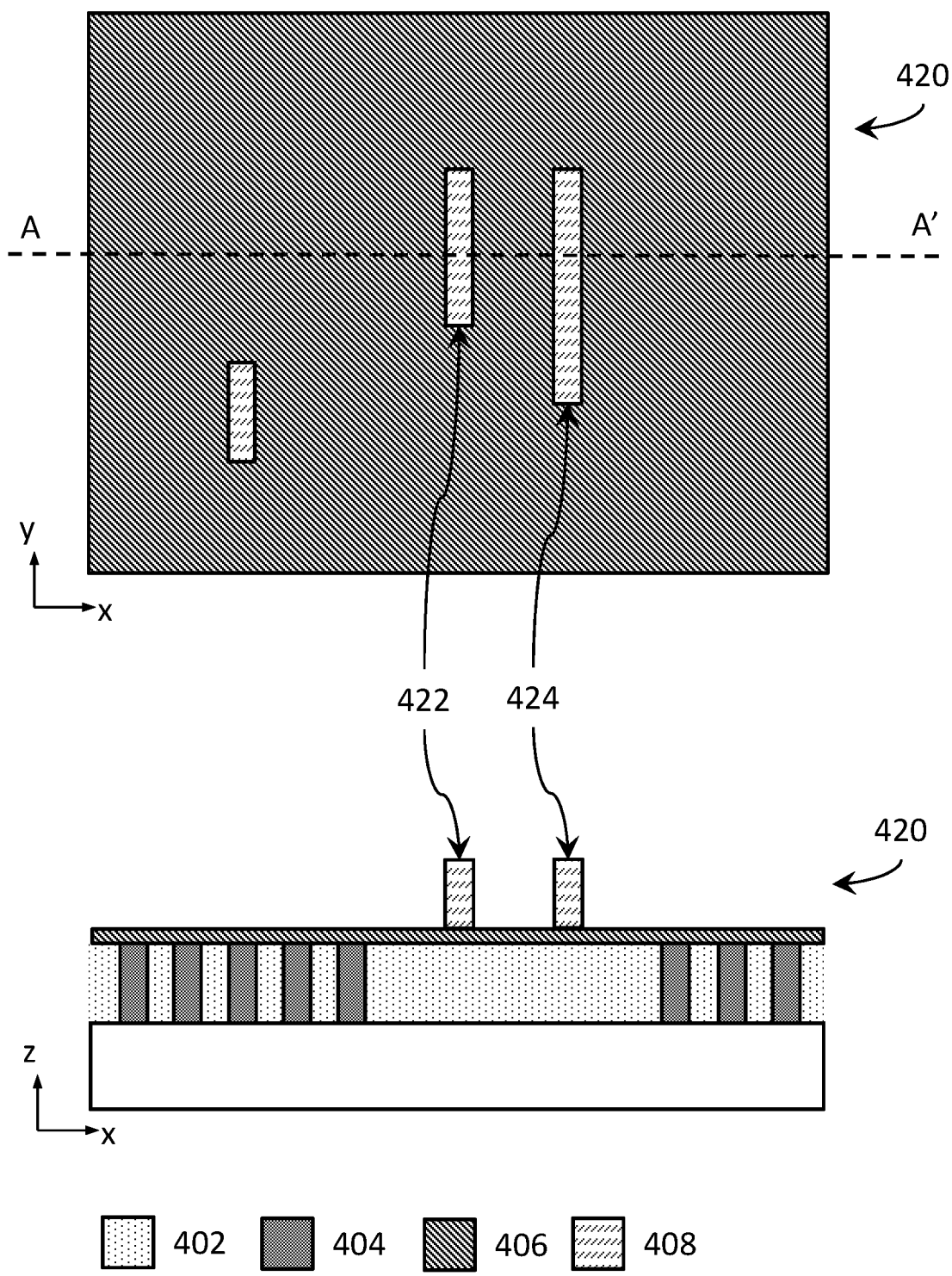

The process 300 proceeds with patterning 306 the mask. FIG. 4D illustrates an example patterned mask 420 formed from the mask 408. Various portions of the mask 408 have been removed, e.g., by exposing these portions of the mask 408 to an ultraviolet light and removing the exposed portions, resulting in the patterned mask 420 illustrated in FIG. 4D.

The example patterned mask 420 shown in FIG. 4D covers portions of the insulator regions 413 and 415 shown in FIG. 4A. For example, the patterned mask 420 includes two lines 422 and 424 that cover portions of the insulator region 413 shown in FIG. 4A. In this example, the mask lines 422 and 424 have a similar width to the lines of metal 404 in the metal grating layer 400. In other examples, the mask lines 422 and 424 may be somewhat wider (e.g., between 1× and 2× as wide) as the lines of metal 404 in the metal grating layer 400.

In this example, the mask lines 422 and 424 have twice the pitch of the lines of metal 404 in the metal grating layer 400. Said another way, if the insulator region 413 was filled by the surrounding metal grating pattern rather than the insulator 402, the mask lines 422 would cover every other line of the metal in the metal grating pattern. In other examples, the patterned mask 420 may have a different pitch. For example, the patterned mask 420 may have the same pitch as the lines of metal 404 in the surrounding metal grating pattern of the metal grating layer 400 (i.e., the mask lines would cover every line of metal in a hypothetical metal grating formed in the insulator region 413), or the patterned mask 420 may have a larger pitch, e.g., three or four times the pitch of the lines of metal 404 in the surrounding metal grating pattern of the metal grating layer 400.

Figure 4E:
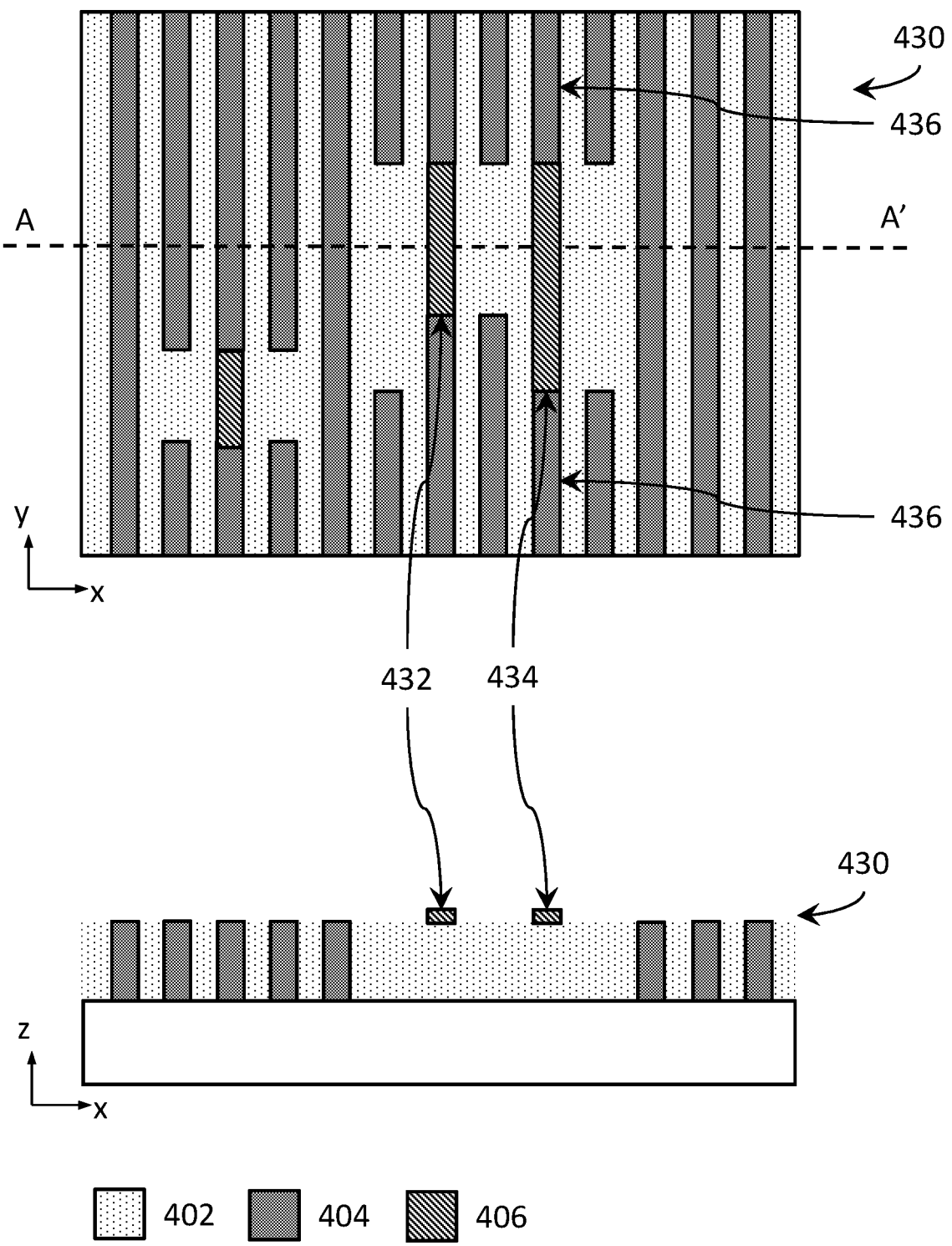

The process 300 proceeds with etching 308 the DSA assist material exposed by the patterned mask. FIG. 4E illustrates an example of patterned DSA assist 430 formed by etching portions of the layer of DSA assist material 406 exposed by the patterned mask 420. The exposed portions of the DSA assist material 406 may be etched using an appropriate etching process and chemistry for the DSA assist material 406. The remaining patterned mask 420 is also removed using an appropriate etching process and chemistry for the mask material, e.g., wet etching or dry etching.

The patterned DSA assist 430 replicates the pattern of the patterned mask 420. For example, the patterned DSA assist 430 includes DSA assist lines 432 and 434, which are formed under the mask lines 422 and 424 shown in FIG. 4D. In some embodiments, e.g., if wider mask lines are formed, the etching process 308 may remove portions of the DSA assist material 406 under the mask lines, e.g., to produce DSA assist lines that are narrower than the mask lines.

Figure 10:
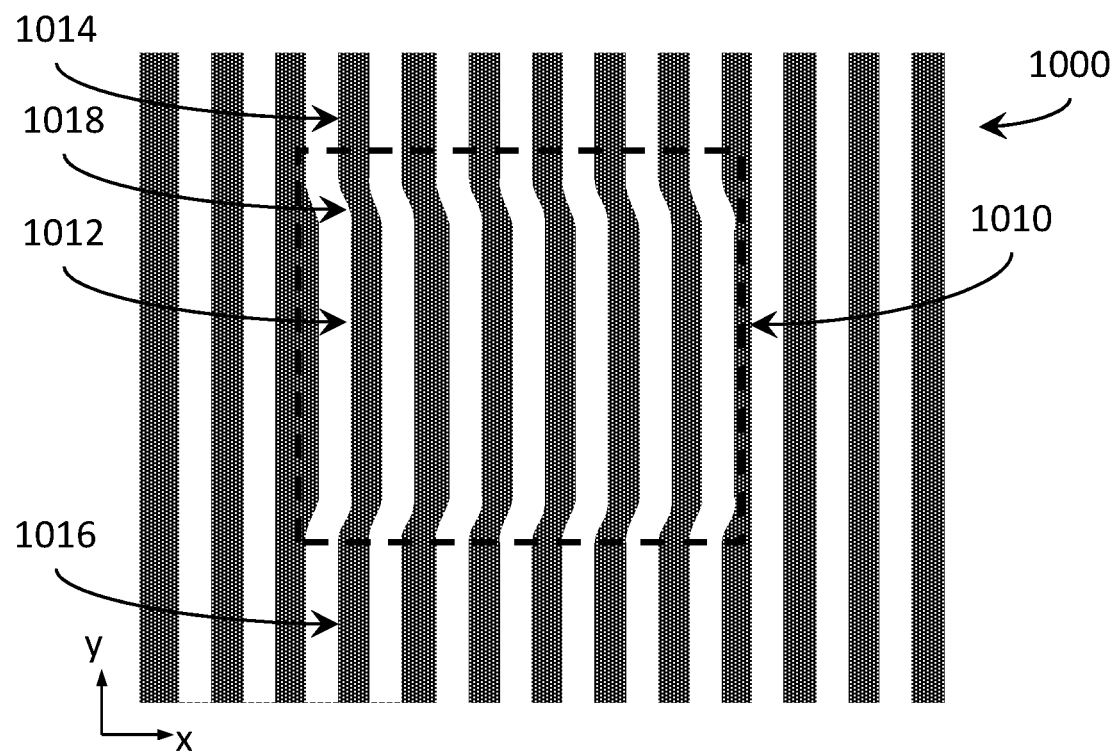
FIG. 10 illustrates a portion of a patterned layer formed over a metal grating layer using the process described with respect to FIGS. 3 and 4, according to some embodiments of the present disclosure.

The patterned DSA assist 430 includes DSA assist lines (e.g., DSA assist lines 432 and 434) that span the insulator regions 410 and 415 between lines of metal 404 in the surrounding metal grating pattern. For example, the DSA assist line 434 spans the insulator region 413 between the metal lines 436 and 438. In the example shown in FIG. 4E, the DSA assist lines are shown as being aligned to the corresponding metal lines (e.g., the DSA assist line 434 is well aligned to the metal lines 436 and 438), and the DSA assist lines match the corresponding metal lines in width. In some cases, a lithographic process used to produce the patterned DSA assist 430 may have some error, e.g., the widths of the DSA assist lines may be somewhat larger or smaller than the width of the metal lines 404, or the DSA assist lines may be offset from the surrounding metal grating. For example, the DSA assist lines may be offset from the surrounding metal grating by an offset amount that is less than the pitch of the metal grating, or by a smaller amount, e.g., less than half the pitch, less than a quarter of the pitch, less than a sixth of the pitch, or less than an eighth of the pitch. Even if there is an offset between the DSA assist lines and the surrounding metal grating, using the DSA assist can improve a DSA result compared to a DSA process without any DSA assist lines, e.g., the processes described with respect to FIGS. 2A and 2B. FIG. 10 illustrates an example outcome if the DSA assist lines are offset from the surrounding metal grating.

Figure 4F:
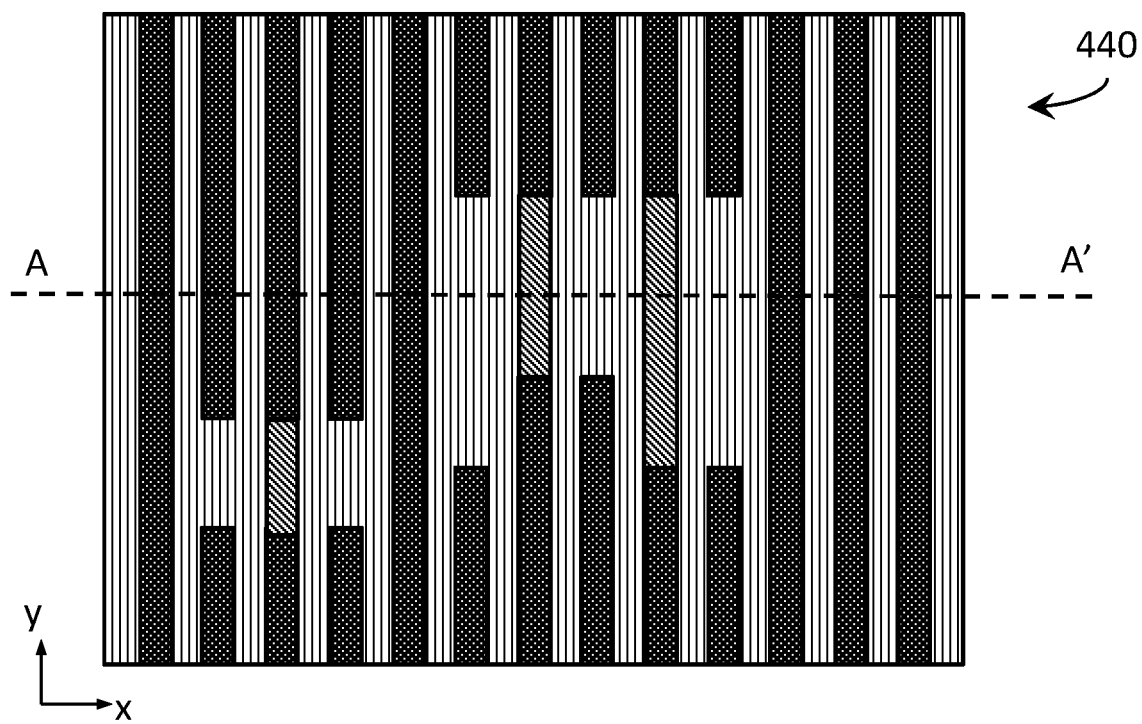
Figure 4F:
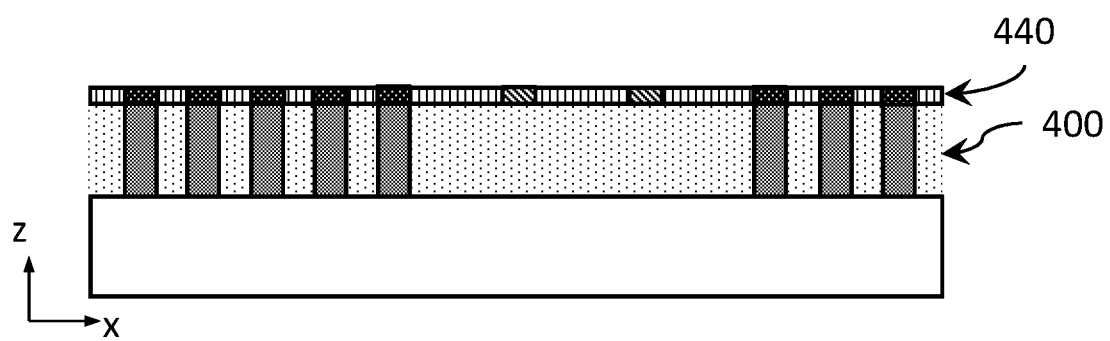
Figure 4F:

Returning to FIG. 3, the process 300 proceeds with depositing 310 a guiding pattern over the patterned metal layer and around the patterned DSA assist. FIG. 4F illustrates an example of a guiding pattern 440 deposited over the metal grating layer 400. As shown in FIG. 4F, the guiding pattern 440 includes the patterned DSA assist 430 formed from the DSA assist material 406. The guiding pattern 440 further includes a first anchoring material 410 and a second anchoring material 412. The first anchoring material 410 covers a portion of the metal grating layer 400, and in particular, covers regions of the insulator 402 in the metal grating layer 400. The second anchoring material 412 covers another portion of the metal grating layer 400, and in particular, covers regions of the metal 404 in the metal grating layer 400.

Figure 4G:
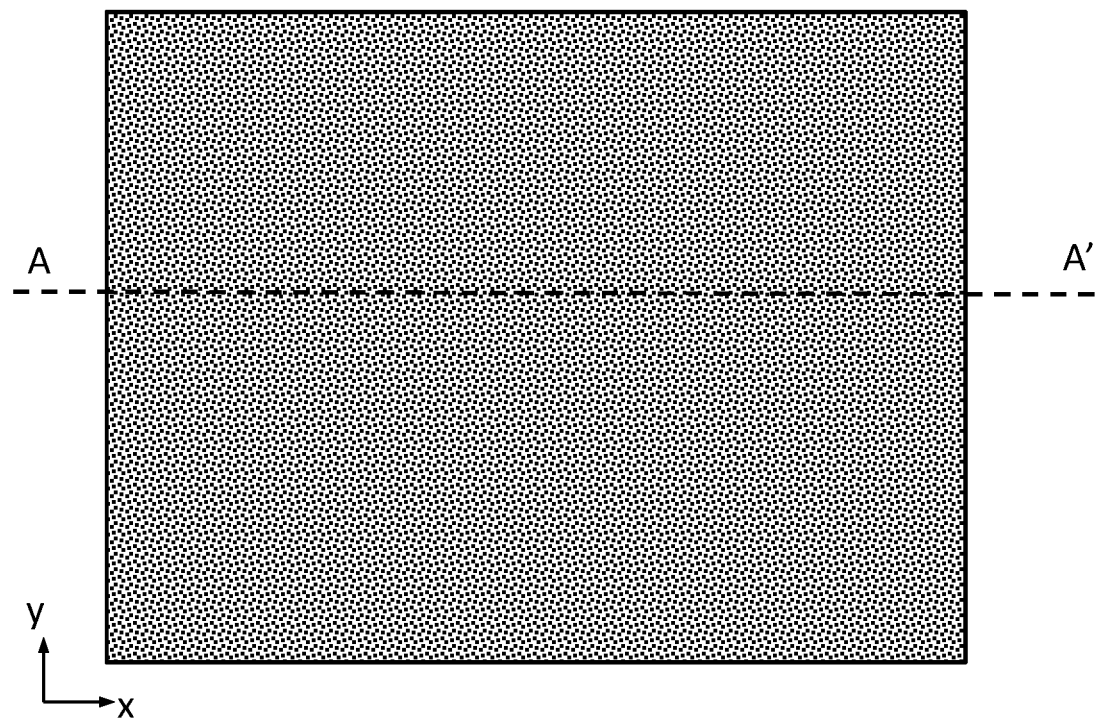
Figure 4G:
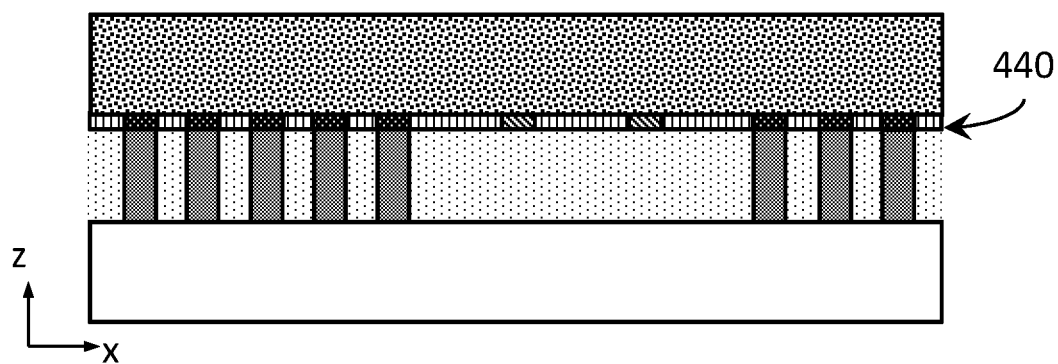
Figure 4G:
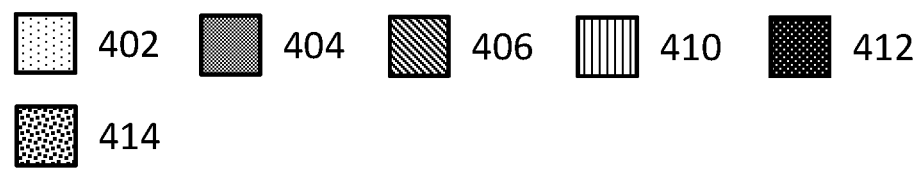
Figure 4H:
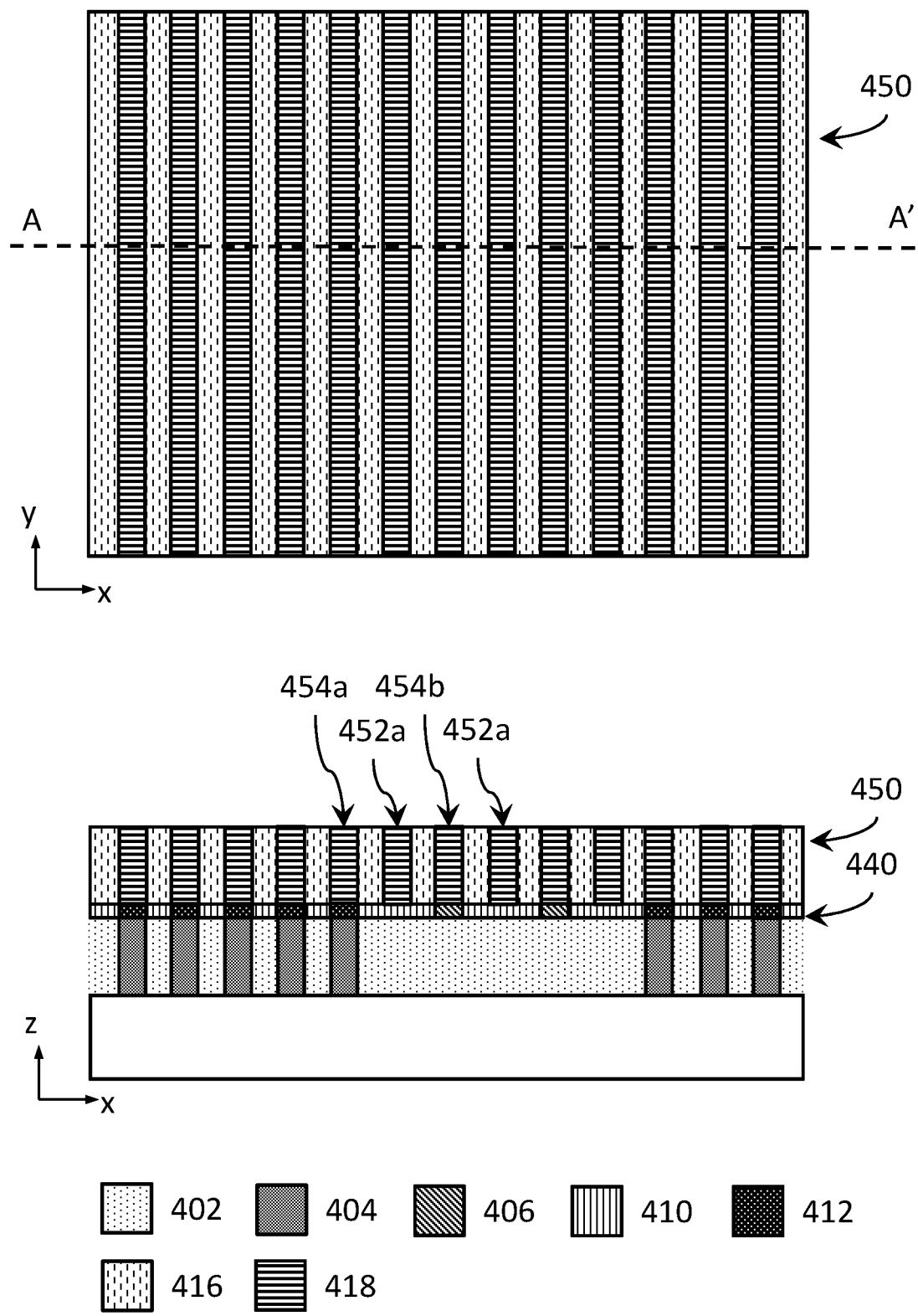

The guiding pattern 440 is used to guide self-assembly of a diblock copolymer deposited over the guiding pattern 440. As discussed further below, the diblock copolymer includes two different types of monomers with different chemical properties. The guiding pattern 440 chemically modifies the surface of the metal grating layer 400 to impose different affinity to different polymer blocks of the diblock copolymer. This enforces the orientation of a diblock copolymer formed over the guiding pattern 440, as illustrated in FIG. 4H. The first anchoring material 410 may have a greater interaction tendency (e.g., repulsive or attractive) with one polymer block than with another, e.g., the first anchoring material 410 attracts a first polymer block (e.g., polymer A) or repels a second polymer block (e.g., polymer B). The DSA assist material 406 and the second anchoring material 412 may attract the polymer block (e.g., polymer B) or repel the first polymer block (e.g., polymer A). In some embodiments, one or more of the DSA assist material 406, first anchoring material 410, or second anchoring material 412 may be a neutral material. For example, the DSA assist material 406 may be neutral, while the first anchoring material 410 that surrounds the DSA assist material 406 in the insulator regions 413 and 415 attract polymer A or repels polymer B. As another example, the first anchoring material 410 may be neutral, while the DSA assist material 406 and second anchoring material 412 attract polymer A and/or repel polymer B. Using a DSA assist material 406, rather than coating the full insulator regions 413 and 415 with the first anchoring material 410 (e.g., as shown in FIG. 2A), may provide improved DSA assembly over the insulator regions 413 and 415 and at the transition region between the regions 413 and 415 and the surrounding metal grating.

In some embodiments, the first anchoring material 410 and the second anchoring material 412 may be deposited by applying coatings of the two different anchoring materials 410 and 412 having different chemical properties (e.g., hydrophilic and hydrophobic properties). In some embodiments, the first anchoring material 410 and the second anchoring material 412 may be applied by spin coating, spray coating, dipping coating, immersion coating, or otherwise depositing or applying a relatively thin coatings of materials that have a chemical property (e.g., a hydrophilicity or hydrophobicity) that corresponds to a chemical property of a particular polymer block. In some embodiments, the chemical properties of the metal grating layer 400 (i.e., the insulator 402 and the metal 404) may influence the placement of the anchoring materials 410 and 412 over the patterned metal grating layer 400. For example, the first anchoring material 410 may tend to adhere to the insulator 402, while the second anchoring material 412 may tend to adhere to the metal 404. Furthermore, the anchoring materials 410 and 412 may be repelled from the DSA assist material 406. Alternatively, some of the second anchoring material 412 may form over the DSA assist material 406. Additionally or alternatively, other types of surface treatments (e.g., oxidizing or de-oxidizing) may be used to modify the surface of the metal grating layer 400 to generate the guiding pattern 440.

After the guiding pattern 440 is deposited, the process 300 proceeds with depositing 312 a solution of a diblock copolymer over the guiding pattern 440. FIG. 4G illustrates an example result of depositing a diblock copolymer 414 over the guiding pattern 440.

The diblock copolymer 414 is a polymeric molecule formed of a chain of covalently bonded monomers. The diblock copolymer 414 may be deposited in a solution comprising the diblock copolymer combined with a liquid solvent, e.g., a glycol ether such as propylene glycol monomethyl ether acetate (PGMEA). The diblock copolymer 414 is formed from two different types of monomers. The different monomers are primarily included within different blocks or contiguous sequences of monomers. For example, a molecule of the diblock copolymer 414 includes a block of first polymer, referred to as, polymer A, and a block of a second polymer, referred to as polymer B. The block of polymer A and the block of polymer B are covalently bonded together. An individual block of polymer A includes predominantly a chain of covalently linked monomer A (e.g., A-A-A-A-A . . . ), whereas the block of polymer B includes predominantly a chain of covalently linked monomer B (e.g., B-B-B-B-B . . . ). The monomers A and B may represent any of the different types of monomers used in block copolymers known in the arts. Examples of the polymer A and polymer B include polyethylene, polystyrene, polyvinylchloride, polytetrafluorethylene, polydimethylsiloxane, some polyesters, some polyurethanes, acrylics, epoxies, P(t-Buytl Acrylate), polyacrylic acid, polyacrylamide, maleic anhydride polymers, polyethylene, polypropylene, polyacrylonitrile, polybutadiene, polyvinyl acetate, polyacetic acid, polybutyl acrylate, polylactic acid, polycaprolactone, poly(ethylene glycol), polyisoprene, poly(methyl methacrylate) (PMMA), and so on. In other embodiments, the polymer A or polymer B may be other polymers. In some embodiments, an individual block may include different types of monomers. For example, the individual block may itself be a copolymer of two or more types of monomers. The blocks of polymer A and polymer B may be of similar lengths or of different lengths.

As noted above, the block of polymer A and the block of polymer B have different chemical properties. As one example, one of the blocks may be relatively more hydrophobic (e.g., water disliking) and the other may be relatively more hydrophilic (water liking). As another example, one of the blocks may be relatively more similar to oil and the other block may be relatively more similar to water. Such differences in chemical properties between the different blocks of polymers, whether a hydrophilic-hydrophobic difference or otherwise, may cause the diblock copolymer 414 to self-assemble. For example, the self-assembly may be based on microphase separation of the polymer blocks. Conceptually, this may be similar to the phase separation of oil and water which are generally immiscible. Similarly, differences in hydrophilicity between the polymer blocks (e.g., one block is relatively hydrophobic and the other block is relatively hydrophilic), may cause a roughly analogous microphase separation where the different polymer blocks try to separate from each other due to chemical dislike for the other.

Returning to FIG. 3, in some embodiments, an annealing process 314 may be performed after the diblock copolymer 414 is deposited in order to initiate, accelerate, or otherwise promote the self-assembly. In some embodiments, the annealing treatment may be a solvent annealing treatment that happens in an atmosphere of solvent vapor. The solvent vapor may be a vapor of acetone, tetrahydrofuran, or other types of organic solvent. The solvent annealing treatment can promote diffusion and self-assembly kinetics of larger polymers, such as diblock copolymers. In other embodiments, the annealing treatment may include a treatment that is operable to increase a temperature of the diblock copolymer. Such a treatment may include heating the IC device (e.g., in an oven or under a thermal lamp), applying infrared radiation to the diblock copolymer, or otherwise applying heat to or increasing the temperature of the deposited layer of the diblock copolymer 414. The heating may help to provide energy to the molecules of the diblock copolymer 414 to make them more mobile and/or flexible, which can increase the rate of the microphase separation. The annealing is performed at a temperature that is high enough to increase the rate of microphase separation but low enough to avoid damaging the diblock copolymer or other components of the IC device. In some embodiments, the annealing temperature is in a range from 50° C. to 300° C.

FIG. 4H illustrates an example result of the self-assembly of the diblock copolymer 414, e.g., after annealing the diblock copolymer 414. In general, because the blocks of polymer A and polymer B are covalently bonded to one another in each diblock copolymer molecule, the blocks of polymer A and polymer B cannot be completely separated on a macroscopic scale. Rather, polymer blocks of a given type may tend to segregate or conglomerate with polymer blocks of the same type of other molecules. Self-assembly of the diblock copolymer 414 into regions of polymer A and polymer B, whether based on hydrophobic-hydrophilic differences or otherwise, is used to form extremely small structures (e.g., precisely spaced nanoscale structures), e.g., the pattern of the self-assembled layer 450 in FIG. 4H.

The self-assembled layer 450 includes regions of polymer A 416 and regions of polymer B 418. The regions of polymer A 416 are formed over the first anchoring material 410. The regions of polymer B 418 are formed over the DSA assist material 406 and the second anchoring material 412. Additional regions of polymer B 418, e.g., the regions 452a and 452b, are formed over the first anchoring material 410 and between other regions of polymer B 418, e.g., the region 452a is formed between the polymer B regions 454a and 454b. Region 454a is formed over the second anchoring material 412, and region 454b is formed over the DSA assist material 406. While region 452a is not over the second anchoring material 412 or the DSA assist material 406, the influence of the surrounding polymer B regions 454a and 454b encourage polymer A 416 and polymer B 418 to extend the striped pattern over the region of the first anchoring material 410 under the region 452a. This is referred to as density multiplication in the self-assembled layer 450, because the di-block copolymer self-assembles in a pattern with a multiplied pitch relative to the underlying guiding pattern. If, as in this example, the di-block copolymer self-assembles with half the pitch of the guiding pattern 440, this may be referred to as pitch-halving. As noted above, in other examples, the DSA assist material 406 may be formed at a different pitch, e.g., at the same pitch as the lines of metal 404 in the metal grating layer 400, or three or four times the pitch of the lines of metal 404 in the metal grating layer 400. In these examples, the pitch of the polymer B 418 regions in the self-assembled layer 450 may still follow the pitch of the underlying metal grating layer 400 in the areas surrounding the insulator regions 413 and 415.

Returning to FIG. 3, the process 300 proceeds with converting 316 polymer A 416 and/or polymer B 418 to a hard mask material. For example, polymer A 416 is selectively etched, and a first hard mask material is deposited in place of polymer A 416. After polymer A 416 is converted to a hard mask, polymer B 418 may be selectively etched, and a second hard mask material is deposited in place of polymer B 418. During this process, the materials in the guiding pattern 440 under polymer A 416 and polymer B 418 may also be etched. In some embodiments, rather than etching one or both of the polymers 416 and 418, a polymer may be converted to a metal oxide, e.g., by sequential infiltration synthesis, vapor phase infiltration, or liquid phase infiltration.

Figure 4I:
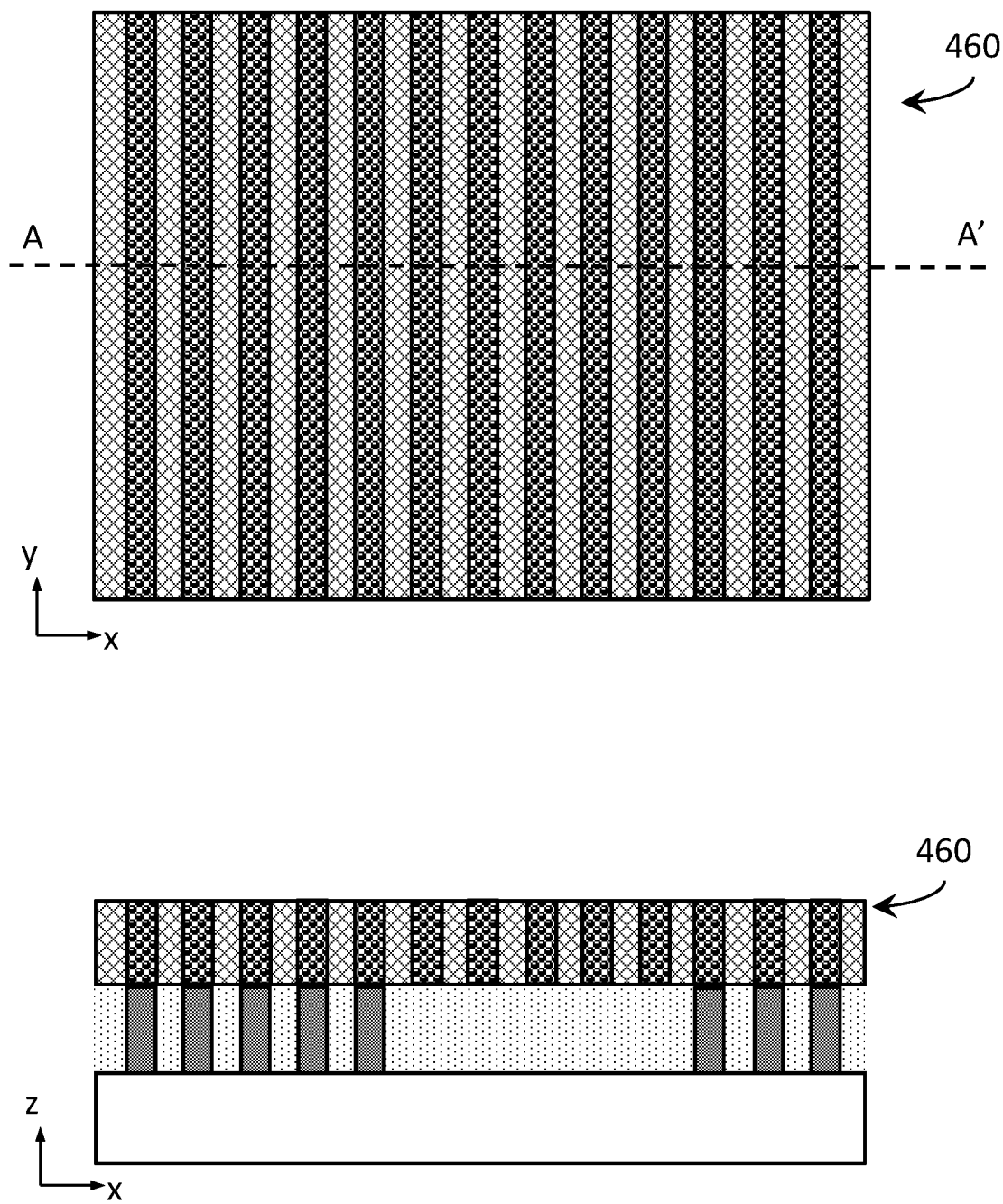
Figure 4I:
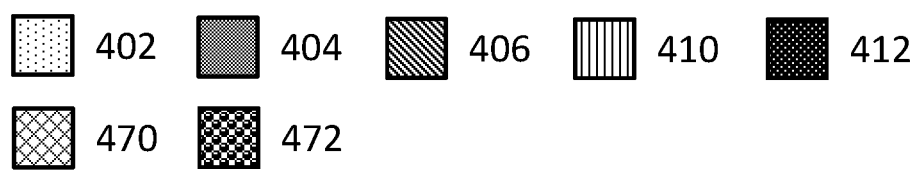

FIG. 4I illustrates an example result of converting polymer A 416 to a first hard mask material 470 and converting polymer B 418 to a second hard mask material 472, to generate a mask layer 460. The hard masks 470 and 472 may be different hard mask materials with strong etch selectivity, so one or both of the hard masks themselves may be selectively etched. This way, portions of one of the hard mask materials (e.g., portions of the second hard mask material replacing polymer B 418) may be selectively etched to form contact holes, and vias may be deposited in the contact holes and coupled to metal 404 in the metal grating layer 400.

Example Non-Uniform Pate Layer and Defects from a DSA Process

FIG. 5 illustrates an example gate layer with multiple gate lengths, and an example DSA error that can occur when DSA is performed over a gate layer with varying gate lengths. FIG. 5 illustrates a cross-section side view of an example gate layer 520 that includes an insulator 502 and a gate material 504. The gate layer 520 is formed over a support structure 506. The gate layer 520 includes gates of different lengths, e.g., the portion of the gate layer illustrated in FIG. 5 includes four gates with the gate length 522, and a gate with the gate length 524. The gate length 524 is longer than the gate length 522, e.g., in this example, the gate length 524 is approximately three times the gate length 522. A gate layer 520 with uniform gate lengths may be compatible with DSA. However, if a gate layer 520 includes two or more different gate lengths, the longer gate lengths may not be compatible with DSA. For example, if a guiding pattern is applied to the gate layer 520 illustrated in FIG. 2, a first anchoring material may be deposited over the insulator 502, and a second anchoring material may be deposited over the gate material 504. The full gate length 524 is coated with second anchoring material, which makes it difficult for a self-assembling diblock copolymer to assemble in its expected striped pattern across the longer gate.

FIG. 5 also illustrates an example DSA error that can occur when DSA is performed over the gate layer 520. FIG. 5 includes a guiding pattern 530 formed over the gate layer 520. The guiding pattern 530 includes a first anchoring material 508 deposited over the insulator 502, and a second anchoring material 510 deposited over the gate material 504. A self-assembling polymer layer 540 is formed over the guiding pattern 530. The self-assembling polymer layer 540 includes regions of polymer A 512 and regions of polymer B 514.

In the region over the gates having the gate length 522, polymer A 512 forms over the insulator 502 and the first anchoring material 508, and polymer B 514 forms over the gate material 504 and the second anchoring material 510. The regions of the polymers 512 and 514 extend across the polymer layer 540 in the z-direction. They also extend across the polymer layer 540 in the y-direction (into the page), forming a striped pattern that aligns with the insulator 502 and the gate material 504.

However, over the longer gate, instead of extending in the z-direction, regions of polymer A 512 and polymer B 514 extend in the x-direction, i.e., the regions of polymer A 512 and polymer B 514 have a flipped morphology from the desired arrangement (i.e., the arrangement over the shorter gates). The expanse of the second anchoring material 510 across the longer gate length 524 may have caused a region 542 of polymer B 514 to form overtop of the second anchoring material 510 over the gate, with polymer A 512 formed overtop of polymer B 514. After the DSA process is performed and the polymers are replaced with different materials, such as hard masks, the region 542 of polymer B 514 becomes trapped in the device. For example, if polymer A 512 is etched and replaced with a different material, the material replacing polymer A 512 is deposited over the region 542, preventing the polymer B 514 in the region 542 from being etched. Alternatively, if polymer B 514 is etched and replaced before polymer A 512, the region of polymer A 512 formed over the region 542 prevents the polymer B 514 in the region 542 from being etched. During further processing of the IC device, the region 542 of trapped polymer B 514 can outgas and lead to de-lamination in the IC device and/or may contaminate the chamber in which the device is being processed. Furthermore, the trapped polymer B 514 can hinder formation of gate contacts to the gate under the region 542 of trapped polymer B 514.

Figure 6:
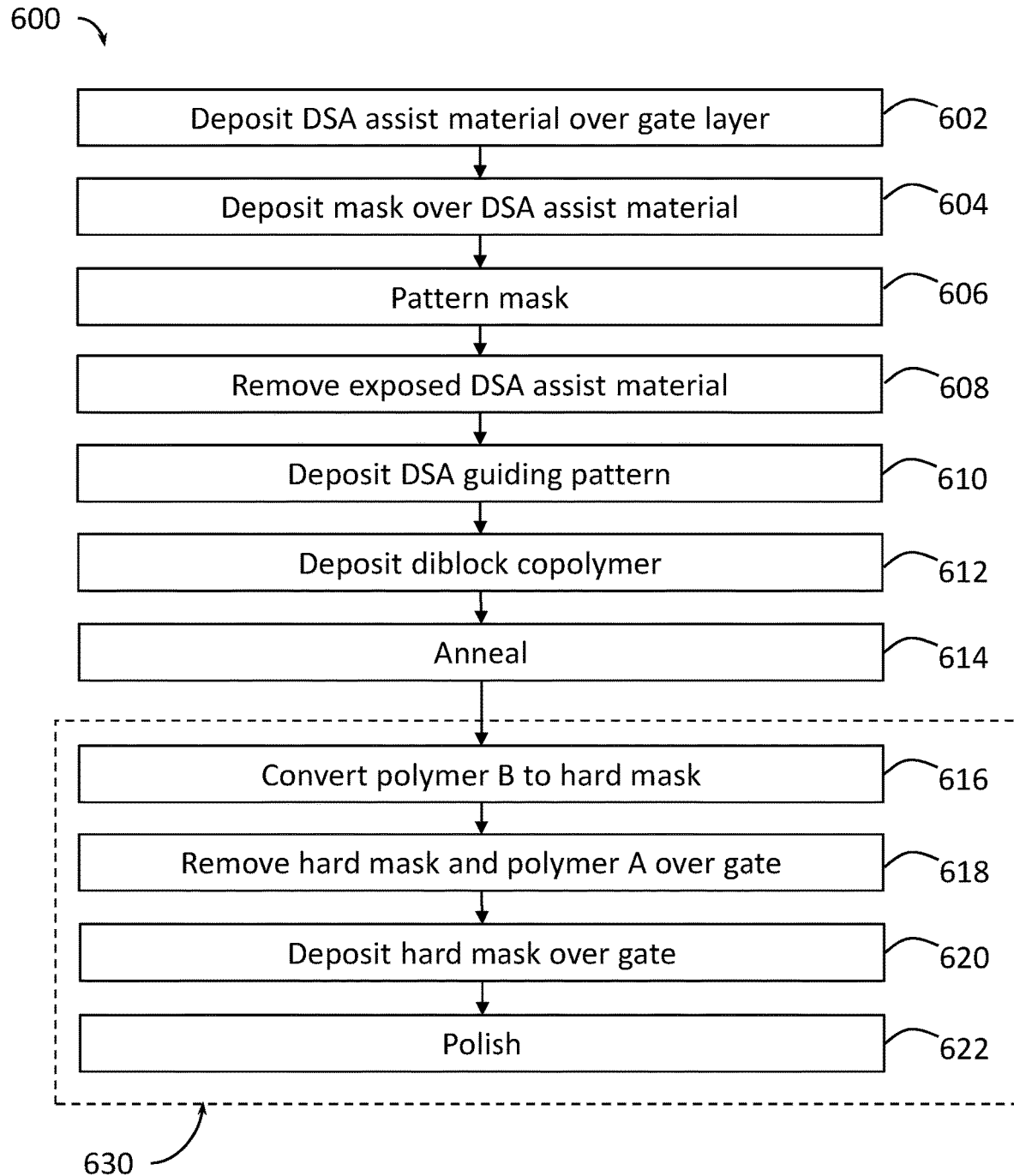
FIG. 6 is a flow chart illustrating a process for generating a patterned layer over a gate layer using DSA assisting features, according to some embodiments of the present disclosure.

Example Process for Generating a Patterned Layer Over a Gate Layer Using DSA-Assisting Features FIG. 6 is a flow chart illustrating a process 600 for generating a patterned layer over a gate layer using DSA assisting features, according to some embodiments of the present disclosure. The process 600 may be used to generate a patterned layer with a high degree of uniformity over a non-uniform gate layer. For example, the gate layer may have multiple gate lengths, as illustrated in FIG. 5. The patterned layer also has a high degree of precision at tight pitches, e.g., at pitches less than 30 nanometers.

FIGS. 7A-7L illustrate various stages in the process of generating the patterned layer according to the process of FIG. 6, according to some embodiments of the present disclosure. More specifically, FIGS. 7A-7L illustrate cross-sectional side views for various stages in the process of generating the patterned layer according to the process 600. In particular, each of FIGS. 7A-7L shows a cross-section side view of the IC structure with the cross-section taken along an x-z plane of the reference coordinate system x-y-z shown in FIGS. 7A-7L.

A number of elements referred to in the description of FIGS. 7A-7L with reference numerals are illustrated in these figures with different patterns, with a legend showing the correspondence between the reference numerals and patterns being provided at the bottom of each drawing page containing FIGS. 7A-7L. For example, the legend illustrates that FIGS. 7A-7L use different patterns to show an insulator 702 and a gate material 704. Furthermore, although certain example gate patterns and gate lengths are illustrated in 7A-7L, this is simply for ease of illustration, and it should be understood that different IC structures having different gate layers may be obtained according to the disclosure. Still further, various IC structure views shown in FIGS. 7A-7L are intended to show relative arrangements of various elements therein, and that various IC structures, or portions thereof, may include other elements or components that are not illustrated (e.g., transistor portions, various components that may be in electrical contact with the capacitor or contacts, etc.).

Figure 7A:
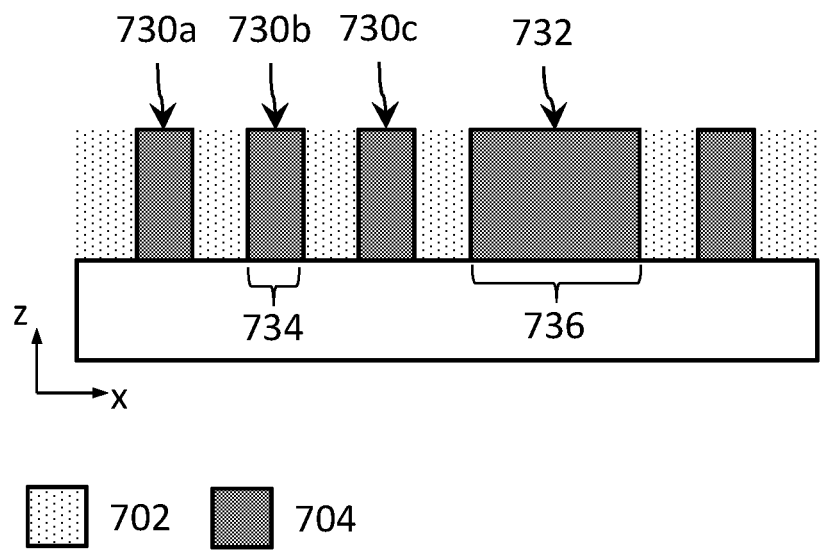
FIGS. 7A-7L illustrate various stages in the process of generating the patterned layer according to the process of FIG. 6, according to some embodiments of the present disclosure.

FIG. 7A illustrates an example of a gate layer 700 including an insulator 702 and a gate material 704. The gate layer 700 is formed over a support structure 705. The support structure 705 may be similar to the support structure 405 described with respect to FIG. 4A. In various embodiments, the support structure 705 may include any such substrate, possibly with some layers and/or devices, e.g., the gate layer 700 and/or one or more layers below the gate layer 700, already formed thereon, providing a suitable surface for forming the patterned layer as described herein.

The insulator 702 may include any insulating medium, such as an interlayer dielectric (ILD). The insulator 702 may include any suitable ILD materials such as silicon oxide, carbon-doped silicon oxide, silicon carbide, silicon nitride, aluminum oxide, and/or silicon oxynitride.

The gate material 704 may include one or more of any metal or other suitable electrically conductive materials (conductors). Such conductive materials may include any suitable electrically conductive material, alloy, or a stack of multiple electrically conductive materials. In some embodiments, the gate material 704 may include one or more metals or metal alloys, with metals such as copper, ruthenium, palladium, platinum, cobalt, nickel, hafnium, zirconium, titanium, tantalum, and aluminum. In some embodiments, the gate material 704 may include one or more electrically conductive alloys, oxides (e.g., conductive metal oxides), carbides (e.g., hafnium carbide, zirconium carbide, titanium carbide, tantalum carbide, and aluminum carbide, tungsten, tungsten carbide), or nitrides (e.g., hafnium nitride, zirconium nitride, titanium nitride, tantalum nitride, and aluminum nitride) of one or more metals.

The gate layer 700 includes gates of different gate lengths. For example, the gates 730a, 730b, and 730c all have a gate length 734. The gate length 734 may be a minimum gate length for the gate layer 700. The gate 732 has a longer gate length 736. For example, the gate length 736 may be, e.g., at least twice the gate length 734, or approximately three times the gate length 736. The gate 732 with the longer gate length 736 may not ordinarily be compatible with a DSA process performed over the gate layer 700, as described with respect to FIG. 5.

While the gate layer 700 is illustrated as including only gates surrounded by an insulator 702, it should be understood that the gate layer 700 may have one or more additional materials or structures. For example, rather than a single insulator material 702, the gate layer 700 may include various insulating materials, e.g., various regions that include dielectric spacers, oxides, and/or ILDs. As another example, one of more of the gates 730 or 732 may be replaced by insulating regions that behave as metal in a DSA process. For example, the gate 730 may have an insulator core surrounded by a non-conducting metal oxide. While the non-conducting metal oxide behaves electrically as an insulator, the metal oxide may behave as a metal for the purposes of the DSA process described herein (e.g., the same anchoring material that adheres to the gate material 704 may adhere to the metal oxide, and regions of a polymer that are formed over the gate material 704 may also be formed over the metal oxide).

Figure 7B:
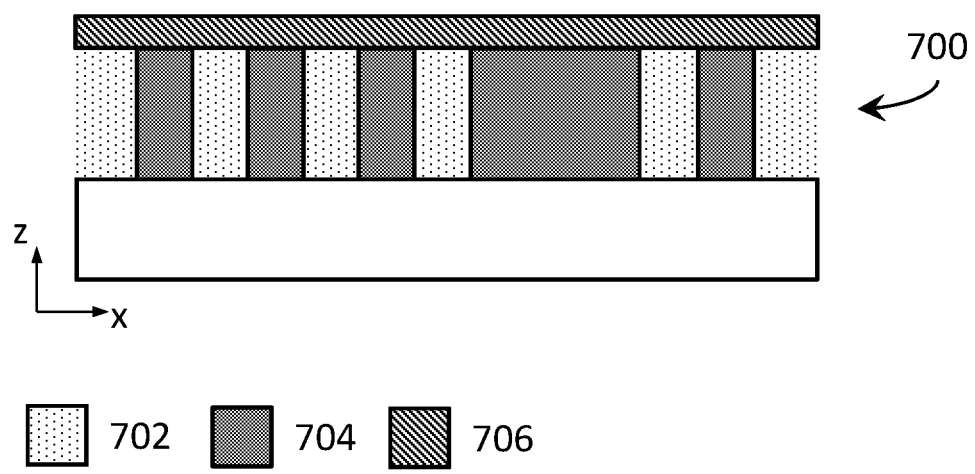

Turning to FIG. 6, the process 600 proceeds with depositing 602 a DSA assist material over a pattered metal layer. FIG. 7B illustrates an example of a DSA assist material 706 deposited over the gate layer 700. The DSA assist material 706 is a material that can serve as part of a guiding pattern to direct the self-assembly of a block polymer. For example, the DSA assist material 706 may have a chemical affinity one of the polymers (e.g., polymer B 718, as described further below) in a block polymer deposited over the DSA assist material 706, or may be a material that can be chemically modified to be affinitive to one of the polymers. For example, the DSA assist material 706 may be a cross-linking polystyrene (X-PS), cross-linking poly methyl methacrylate (X-PMMA), or aluminum oxide.

Figure 7C:
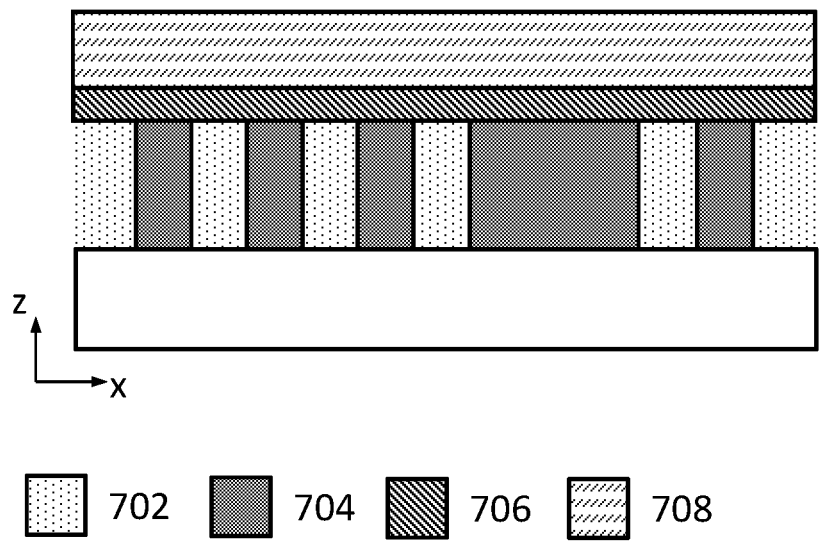

The process 600 proceeds with depositing 604 a mask over the DSA assist material. FIG. 7C illustrates an example of mask 708 deposited over the DSA assist material 706. The mask 708 may include any dielectric hard mask material or another mask material known in the art.

Figure 7D:
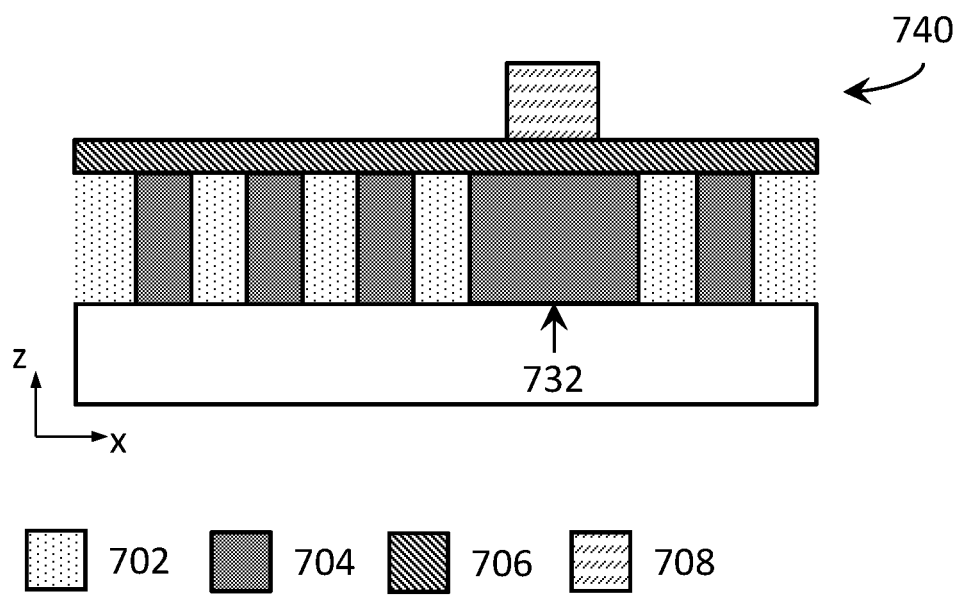

The process 600 proceeds with patterning 606 the mask. FIG. 7D illustrates an example patterned mask 740 formed from the mask 708. Various portions of the mask 708 have been removed, e.g., by exposing these portions of the mask 708 to an ultraviolet light and removing the exposed portions, resulting in the patterned mask 740 illustrated in FIG. 7D.

The example patterned mask 740 shown in FIG. 7D covers a portion of the gate 732. In this example, the patterned mask 740 includes a line that covers a central region of the gate 732. As noted with respect to FIG. 7A, the gate 732 is wider than the other gates 730, e.g., approximately three times the width. The patterned mask 740 may include similar lines in the central regions of other long gates or other wide features, e.g., other features that are wider than the minimum gate length 734 (e.g., at least twice as wide as the minimum pitch, or at least three times as wide as the minimum pitch). If a feature has an even larger size, e.g., a gate has a gate length that is five times the minimum pitch, the patterned mask 740 may include multiple lines across the gate length. More generally, the lines in the patterned mask 740 may replicate the pattern of the insulator 702 in the gate layer 700. In this example, the mask line over the gate 732 is slightly wider than the minimum gate length 734, but the mask line may be narrower (e.g., approximately the minimum gate length 734) or wider (e.g., up to two times the minimum gate length 734, or more depending on the etch chemistry used for etching portions of the DSA assist material 706).

Figure 7E:
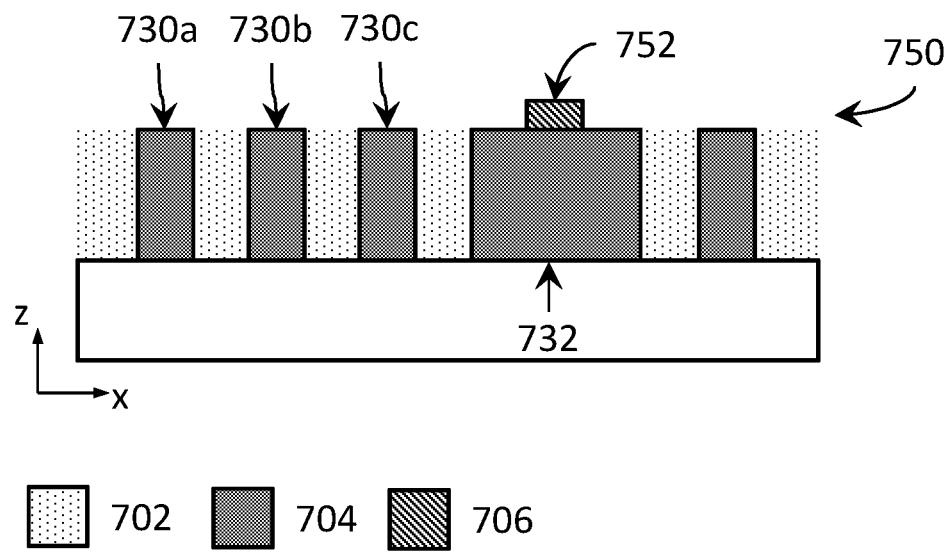

The process 600 proceeds with etching 608 the DSA assist material exposed by the patterned mask. FIG. 7E illustrates an example of patterned DSA assist 750 formed by etching portions of the layer of DSA assist material 706 exposed by the patterned mask 740. The exposed portions of the DSA assist material 706 may be etched using an appropriate etching process and chemistry for the DSA assist material 706. The remaining patterned mask 740 is also removed using an appropriate etching process and chemistry for the mask material, e.g., wet etching or dry etching.

The patterned DSA assist 750 replicates the pattern of the patterned mask 740. For example, the patterned DSA assist 750 includes a DSA assist line 752, which is formed under the mask line shown in FIG. 7D. In this example, the etching process 608 removed a portion of the DSA assist material 706 under the mask line, e.g., to produce a DSA assist lines that are narrower than the mask line. The DSA assist line 752 extends along the width of the gate (i.e., into the page in the y-direction in the coordinate system used in FIG. 7) and along the center of the length of the gate 732.

Figure 11:
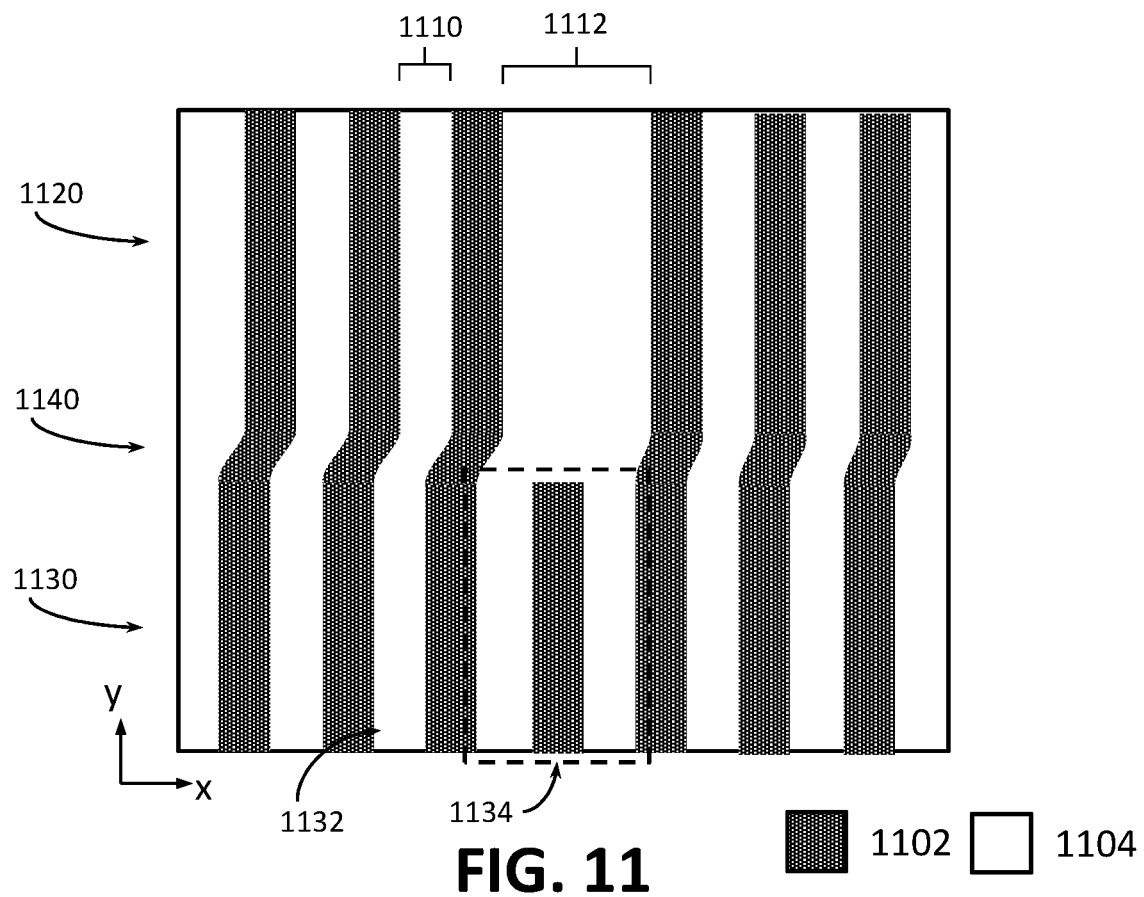
FIG. 11 illustrates a portion of a patterned layer formed over a gate layer using any of the processes described with respect to FIGS. 6-9, according to some embodiments of the present disclosure.

The DSA assist line 752 is aligned to the pattern of the insulator 702, e.g., if the pattern of the gates 730 were replicated through the gate 732, the DSA assist line 752 is located where a line of insulator 702 would be. In some cases, a lithographic process used to produce the patterned DSA assist 750 may have some error, e.g., the widths of the DSA assist lines may be somewhat larger or smaller than the width of the line of insulator 702, or the DSA assist lines may be offset from their expected placement (e.g., the DSA assist line 752 may not be centered along the gate 732). For example, the DSA assist lines may be offset by an offset amount that is less than a minimum pitch between gates (e.g., less than the pitch between the gates 730), or by a smaller amount, e.g., less than half the pitch, less than a quarter of the pitch, less than a sixth of the pitch, or less than an eighth of the pitch. Even if there is an offset between the DSA assist lines and the surrounding gate layer, using the DSA assist can improve a DSA result compared to a DSA process without any DSA assist lines, e.g., the process illustrated in FIG. 5. FIG. 11 illustrates an example outcome if the DSA assist lines are offset from the surrounding gate layer.

Figure 7F:
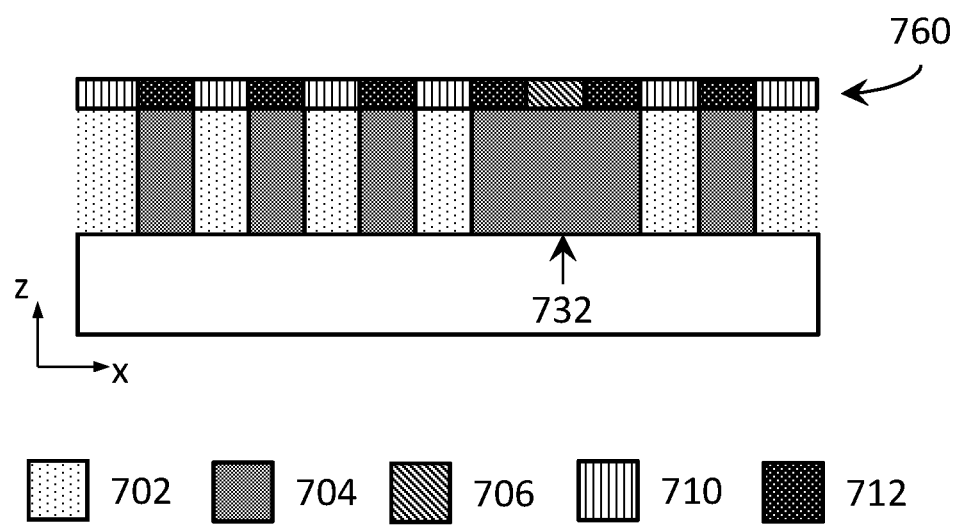

Returning to FIG. 6, the process 600 proceeds with depositing 610 a guiding pattern over the patterned metal layer and around the patterned DSA assist. FIG. 6F illustrates an example of a guiding pattern 760 deposited over the gate layer 700. As shown in FIG. 7F, the guiding pattern 760 includes the patterned DSA assist 750 formed from the DSA assist material 706. The guiding pattern 760 further includes a first anchoring material 710 and a second anchoring material 712. The first anchoring material 710 covers a portion of the gate layer 700, and in particular, covers regions of the insulator 702 in the gate layer 700. The second anchoring material 712 covers another portion of the gate layer 700, and in particular, covers regions of the gate material 704 in the gate layer 700.

Figure 7G:
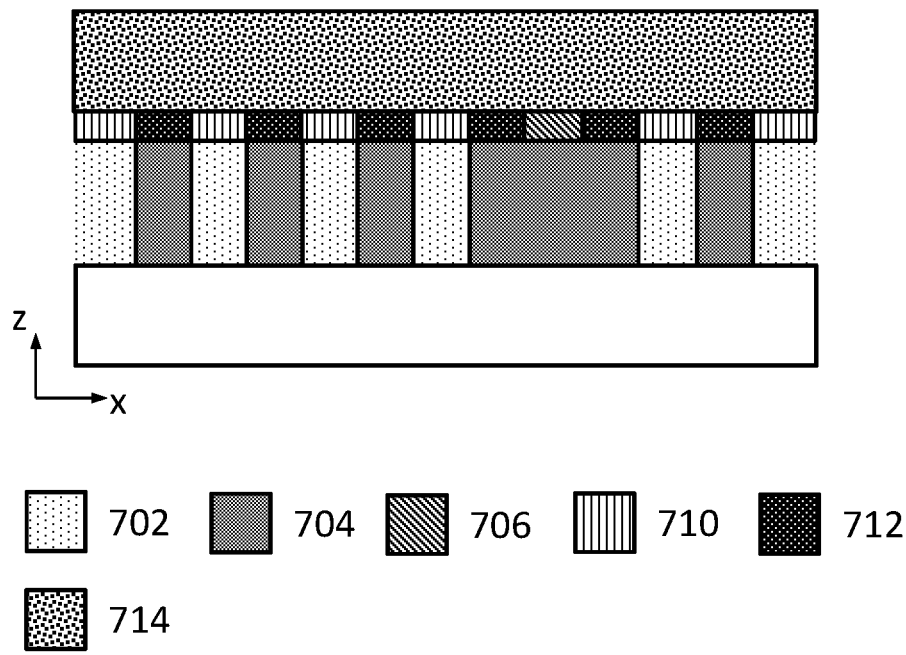
Figure 7H:
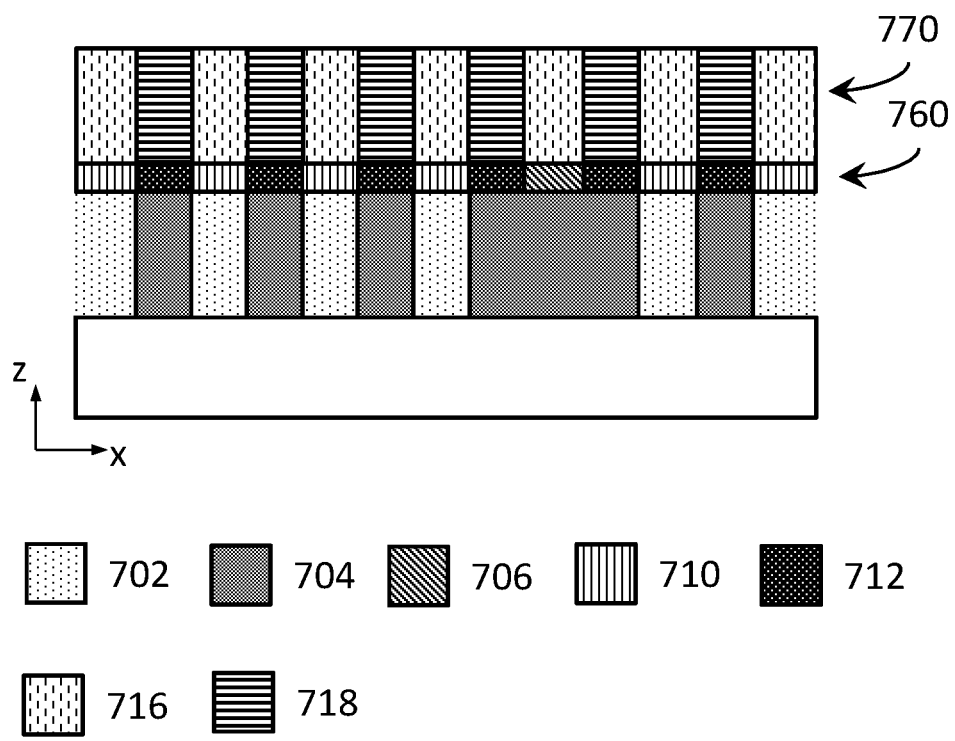

The guiding pattern 760 is used to guide self-assembly of a diblock copolymer deposited over the guiding pattern 760. As discussed further below, the diblock copolymer includes two different types of monomers with different chemical properties. The guiding pattern 760 chemically modifies the surface of the gate layer 700 to impose different affinity to different polymer blocks of the diblock copolymer. This enforces the orientation of a diblock copolymer formed over the guiding pattern 760, as illustrated in FIG. 7H. The first anchoring material 710 and the DSA assist material 706 may have a greater interaction tendency (e.g., repulsive or attractive) with one polymer block than with another, e.g., the first anchoring material 710 and/or the DSA assist material 706 may attract a first polymer block (e.g., polymer A) or repels a second polymer block (e.g., polymer B). The second anchoring material 712 may attract the polymer block (e.g., polymer B) or repel the first polymer block (e.g., polymer A). In some embodiments, one or more of the DSA assist material 706, first anchoring material 710, or second anchoring material 712 may be a neutral material. For example, the DSA assist material 706 may be neutral, while the second anchoring material 712 that surrounds the DSA assist material 706 over the gate 732 attracts polymer B or repels polymer A. Using a neutral DSA assist material 706, rather than coating the full gate 732 with the second anchoring material 712 (e.g., as shown in FIG. 5), may provide improved DSA assembly over the gate 732.

In some embodiments, the first anchoring material 710 and the second anchoring material 712 may be deposited by applying coatings of the two different anchoring materials 710 and 712 having different chemical properties (e.g., hydrophilic and hydrophobic properties). In some embodiments, the first anchoring material 710 and the second anchoring material 712 may be applied by spin coating, spray coating, dipping coating, immersion coating, or otherwise depositing or applying a relatively thin coatings of materials that have a chemical property (e.g., a hydrophilicity or hydrophobicity) that corresponds to a chemical property of a particular polymer block. In some embodiments, the chemical properties of the gate layer 700 (i.e., the insulator 702 and the gate material 704) may influence the placement of the anchoring materials 710 and 712 over the gate layer 700. For example, the first anchoring material 710 may tend to adhere to the insulator 702, while the second anchoring material 712 may tend to adhere to the gate material 704. Furthermore, the anchoring materials 710 and 712 may be repelled from the DSA assist material 706. Alternatively, some of the first anchoring material 710 may form over the DSA assist material 706. Additionally or alternatively, other types of surface treatments (e.g., oxidizing or de-oxidizing) may be used to modify the surface of the gate layer 700 to generate the guiding pattern 760.

After the guiding pattern 760 is deposited, the process 600 proceeds with depositing 712 a solution of a diblock copolymer over the guiding pattern 760. FIG. 7G illustrates an example result of depositing a diblock copolymer 714 over the guiding pattern 760.

The diblock copolymer 714 is a polymeric molecule formed of a chain of covalently bonded monomers. The diblock copolymer 714 may be deposited in a solution comprising the diblock copolymer combined with a liquid solvent, e.g., a glycol ether such as propylene glycol monomethyl ether acetate (PGMEA). The diblock copolymer 714 is formed from two different types of monomers. The different monomers are primarily included within different blocks or contiguous sequences of monomers. For example, a molecule of the diblock copolymer 714 includes a block of first polymer, referred to as, polymer A, and a block of a second polymer, referred to as polymer B. The block of polymer A and the block of polymer B are covalently bonded together. An individual block of polymer A includes predominantly a chain of covalently linked monomer A (e.g., A-A-A-A-A . . . ), whereas the block of polymer B includes predominantly a chain of covalently linked monomer B (e.g., B-B-B-B-B . . . ). The monomers A and B may represent any of the different types of monomers used in block copolymers known in the arts. Examples of the polymer A and polymer B include polyethylene, polystyrene, polyvinylchloride, polytetrafluoroethylene, polydimethylsiloxane, some polyesters, some polyurethanes, acrylics, epoxies, P(t-Buytl Acrylate), polyacrylic acid, polyacrylamide, maleic anhydride polymers, polyethylene, polypropylene, polyacrylonitrile, polybutadiene, polyvinyl acetate, polyacetic acid, polybutyl acrylate, polylactic acid, polycaprolactone, poly(ethylene glycol), polyisoprene, poly(methyl methacrylate) (PMMA), and so on. In other embodiments, the polymer A or polymer B may be other polymers. In some embodiments, an individual block may include different types of monomers. For example, the individual block may itself be a copolymer of two or more types of monomers. The blocks of polymer A and polymer B may be of similar lengths or of different lengths.

As noted above, the block of polymer A and the block of polymer B have different chemical properties. As one example, one of the blocks may be relatively more hydrophobic (e.g., water disliking) and the other may be relatively more hydrophilic (water liking). As another example, one of the blocks may be relatively more similar to oil and the other block may be relatively more similar to water. Such differences in chemical properties between the different blocks of polymers, whether a hydrophilic-hydrophobic difference or otherwise, may cause the diblock copolymer 714 to self-assemble. For example, the self-assembly may be based on microphase separation of the polymer blocks. Conceptually, this may be similar to the phase separation of oil and water which are generally immiscible. Similarly, differences in hydrophilicity between the polymer blocks (e.g., one block is relatively hydrophobic and the other block is relatively hydrophilic), may cause a roughly analogous microphase separation where the different polymer blocks try to separate from each other due to chemical dislike for the other.

Returning to FIG. 6, in some embodiments, an annealing process 614 may be performed after the diblock copolymer 714 is deposited in order to initiate, accelerate, or otherwise promote the self-assembly. In some embodiments, the annealing treatment may be a solvent annealing treatment that happens in an atmosphere of solvent vapor. The solvent vapor may be a vapor of acetone, tetrahydrofuran, or other types of organic solvent. The solvent annealing treatment can promote diffusion and self-assembly kinetics of larger polymers, such as diblock copolymers. In other embodiments, the annealing treatment may include a treatment that is operable to increase a temperature of the diblock copolymer. Such a treatment may include heating the IC device (e.g., in an oven or under a thermal lamp), applying infrared radiation to the diblock copolymer, or otherwise applying heat to or increasing the temperature of the deposited layer of the diblock copolymer 714. The heating may help to provide energy to the molecules of the diblock copolymer 714 to make them more mobile and/or flexible, which can increase the rate of the microphase separation. The annealing is performed at a temperature that is high enough to increase the rate of microphase separation but low enough to avoid damaging the diblock copolymer or other components of the IC device. In some embodiments, the annealing temperature is in a range from 50° C. to 300° C.

FIG. 7H illustrates an example result of the self-assembly of the diblock copolymer 714, e.g., after annealing the diblock copolymer 714. In general, because the blocks of polymer A and polymer B are covalently bonded to one another in each diblock copolymer molecule, the blocks of polymer A and polymer B cannot be completely separated on a macroscopic scale. Rather, polymer blocks of a given type may tend to segregate or conglomerate with polymer blocks of the same type of other molecules. Self-assembly of the diblock copolymer 714 into regions of polymer A and polymer B, whether based on hydrophobic-hydrophilic differences or otherwise, is used to form extremely small structures (e.g., precisely spaced nanoscale structures), e.g., the pattern of the self-assembled layer 770 in FIG. 7H.

The self-assembled layer 770 includes regions of polymer A 716 and regions of polymer B 718. The regions of polymer A 716 are formed over the DSA assist material 406 and the first anchoring material 710. The regions of polymer B 716 are formed over the second anchoring material 712.

Figure 7I:
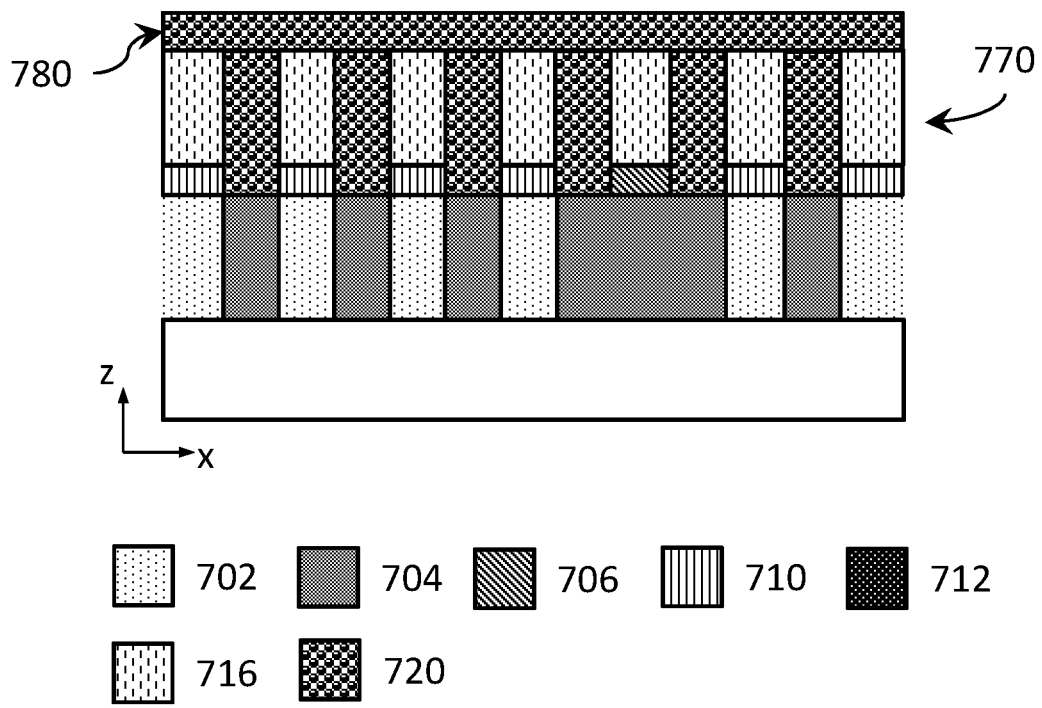

Returning to FIG. 6, the process 600 proceeds with converting 616 polymer B to a hard mask material. FIG. 7I illustrates an example result of converting polymer B 718 to a hard mask material 720. For example, polymer B 718 is selectively etched, and the hard mask material 720 is deposited in place of polymer B 718. In other embodiments, rather than etching polymer B 718 and depositing a hard mask material, polymer B 718 may be converted to the hard mask material 720, e.g., a metal oxide, e.g., by sequential infiltration synthesis, vapor phase infiltration, or liquid phase infiltration. An additional layer 780 of the hard mask material 720 or a different hard mask material may be deposited over the self-assembled layer 770 after polymer B 718 has been converted to the hard mask material 720, as illustrated in FIG. 7I.

Figure 7J:
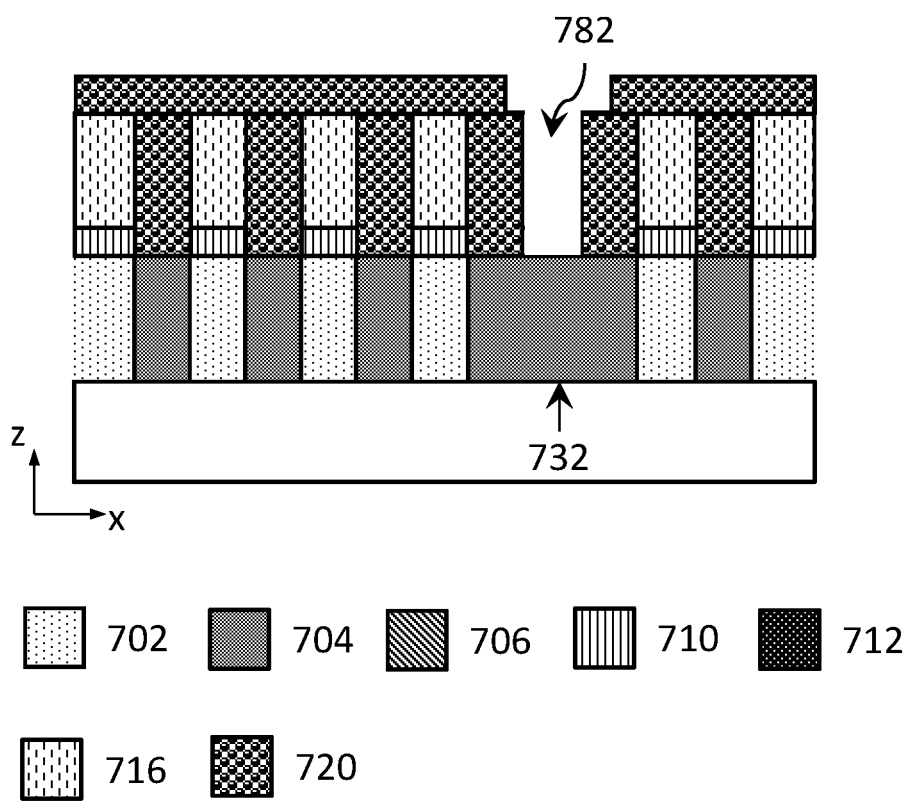

The process 600 proceeds with removing 618 the hard mask and polymer A over large structures in the gate layer. FIG. 7J illustrates an example result of etching a portion of the hard mask material 720 over the gate 732 and etching the region of polymer A 716 over the gate 732. The removed portion of the layer 780 of the hard mask material 720 may be lithographically patterned and etched. The region of polymer A 716 under the removed portion of the layer 780 is selectively etched, e.g., using an etching process that removes polymer A 716 but leaves the hard mask material 720 substantially intact. This results in an opening 782 to the gate 732.

Figure 7K:
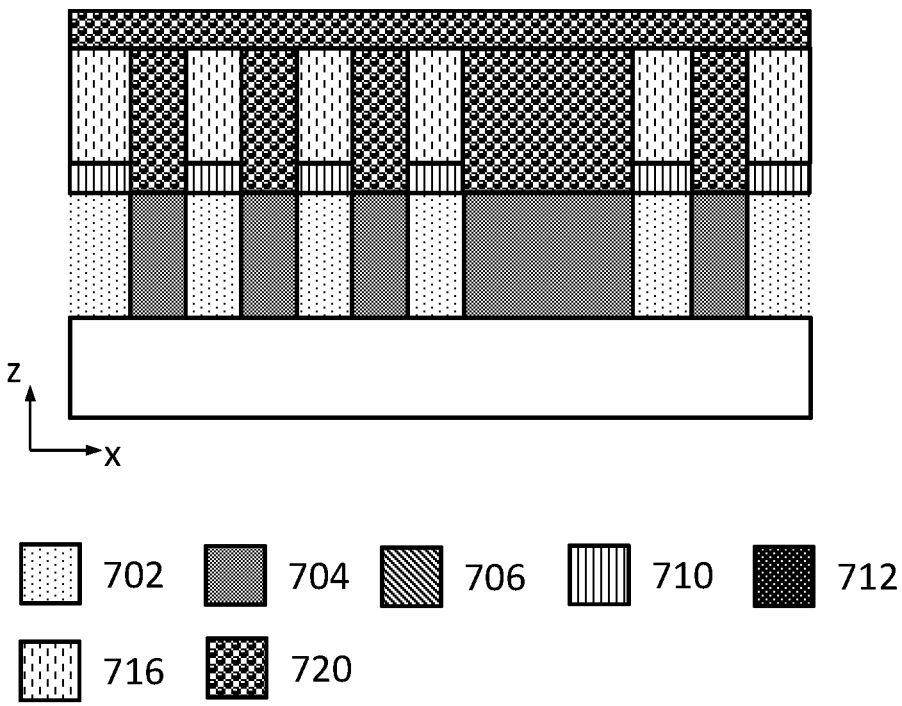

The process 600 proceeds with depositing 620 a hard mask material over the gate, and in particular, into openings created by the process 618. FIG. 7K illustrates an example result of depositing the hard mask material 720 into the opening 782 over the gate 732. The full gate length of the gate 732 is now coated by the hard mask material 720. More generally, the hard mask material 720 is deposited over all of the gates 730 and 732 in the gate layer 700.

Figure 7L:
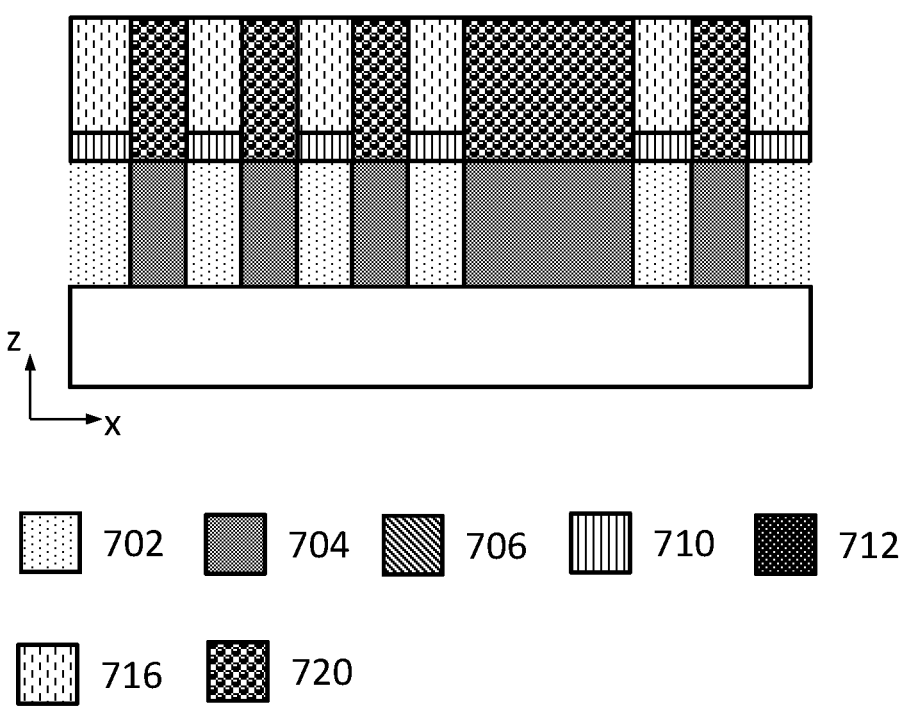

In some embodiments, the process 600 proceeds with polishing 620 the top layer of hard mask material to reveal the self-assembled layer 770. FIG. 7L illustrates an example result of polishing the top layer 780 of the hard mask material 720. In some embodiments, after the top layer 780 is polished, polymer A 416 may be converted to a second hard mask material using a similar process to converting 616 polymer B 718 to the hard mask material 720. The hard mask material 720 (which may be considered a first hard mask material) and the second hard mask material may be different hard mask materials with strong etch selectivity, so one or both of the hard masks themselves may be selectively etched. This way, portions of one of the hard mask materials (e.g., portions of the hard mask material 720 replacing polymer B 418) may be selectively etched to form contact holes, and vias may be deposited in the contact holes and coupled to gates 730 and/or 732 in the gate layer 700. In some embodiments, polymer A 716 may be converted to the second hard mask material earlier in the process, e.g., between processes 614 and 616. When polymer A 716 and polymer B 718 are converted to hard masks, the self-assembled layer 770 may be considered a hard mask layer.

Alternate Process for Converting a Self-Assembled Layer to a Hard Mask Layer

Figure 8:
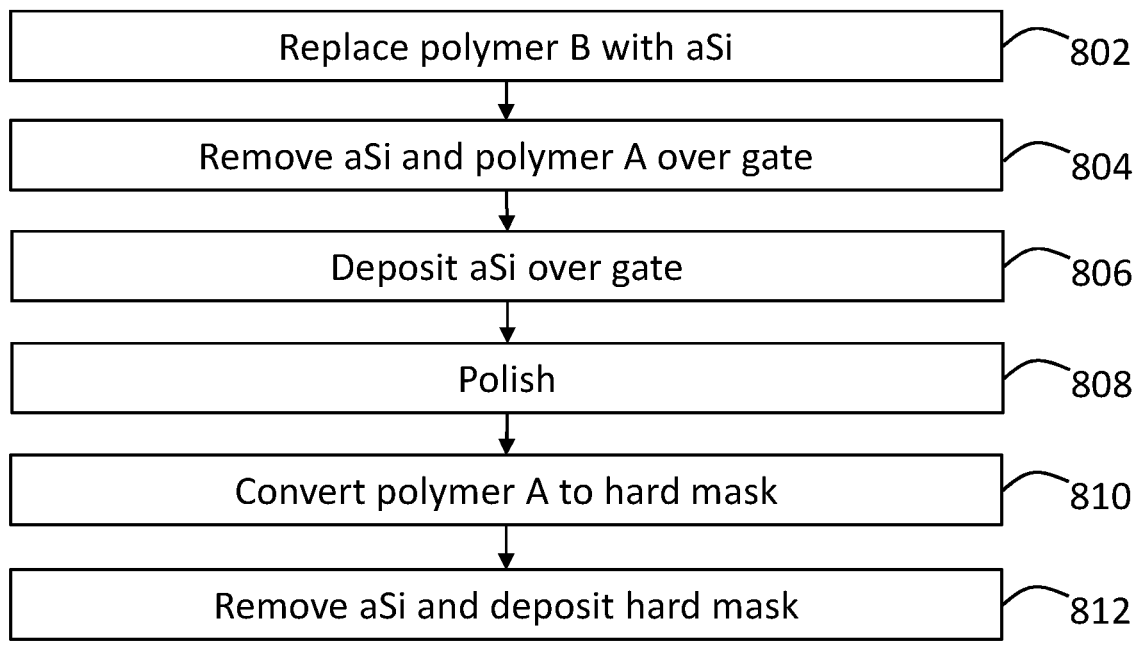
FIG. 8 is a flow chart illustrating an alternate process for replacing a self-assembled polymer layer with hard mask materials, according to some embodiments of the present disclosure.

Processes 616-622 described above illustrate one example sub-process 630 for converting the self-assembled layer 770 to a hard mask layer, with single hard mask material extending across all much or all of the gate lengths of all of the gate structures. FIG. 8 is a flow chart illustrating an alternate process 800 for replacing a self-assembled polymer layer with hard mask materials, according to some embodiments of the present disclosure. The process 800 may be performed instead of the sub-process 630, e.g., following the annealing process 614 described above.

FIGS. 9A-9F illustrate various stages in the process of replacing the self-assembled polymer layer with hard mask materials according to the process of FIG. 8, according to some embodiments of the present disclosure. More specifically, FIGS. 9A-9F illustrate cross-sectional side views for various stages in the process 800. For convenience, many of the same patterns and numbers from FIG. 7 are used in FIG. 9.

Figure 9A:
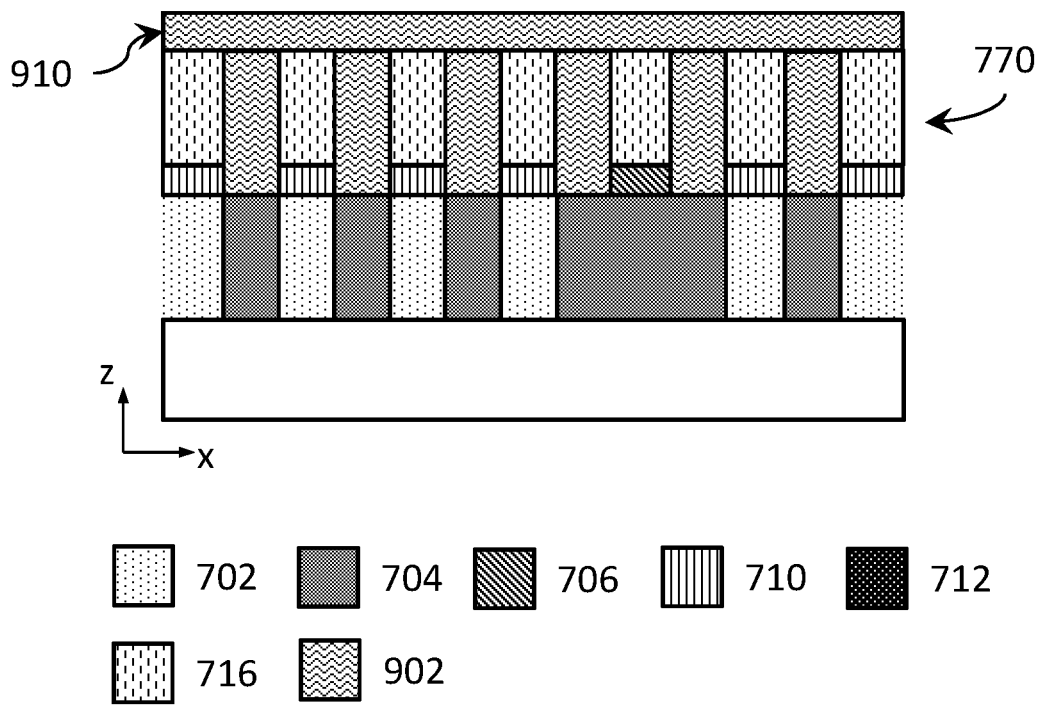
FIGS. 9A-9F illustrate various stages in the process of replacing the polymer layer with hard mask materials according to the process of FIG. 8, according to some embodiments of the present disclosure.

The process 800 begins with replacing polymer B with amorphous silicon (aSi). FIG. 9A illustrates an example result of replacing polymer B 718 with aSi 902. For example, polymer B 718 is selectively etched, and aSi 902 is deposited in place of polymer B 718. An additional layer 910 of aSi 902 may be deposited over the self-assembled layer 770 after the polymer B 718 in the self-assembled layer 770 has been replaced with aSi 902, as illustrated in FIG. 9A.

Figure 9B:
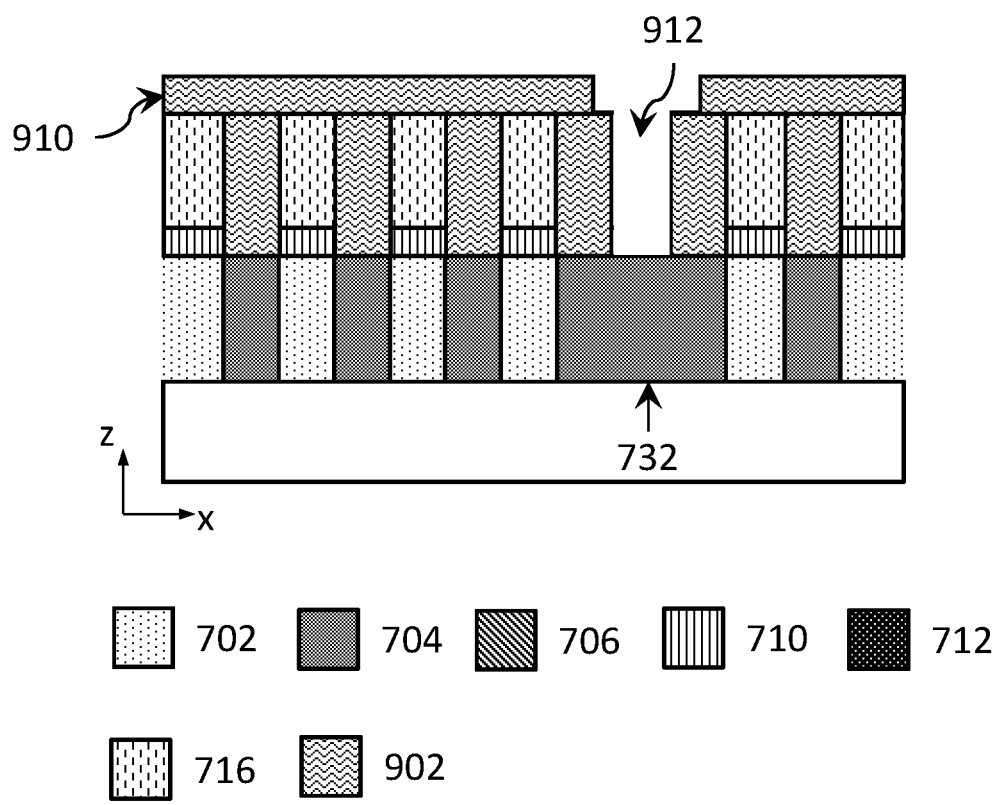

The process 800 proceeds with removing 804 the aSi and polymer A over large structures in the gate layer. FIG. 9B illustrates an example result of etching a portion of the aSi 902 over the gate 732 and etching the region of polymer A 716 over the gate 732. The removed portion of the layer 910 of the aSi 902 may etched using a lithographic process. The region of polymer A 716 under the removed portion of the layer 910 is selectively etched, e.g., using an etching process that removes polymer A 716 but leaves the aSi 902 substantially intact. This results in an opening 912 to the gate 732.

Figure 9C:
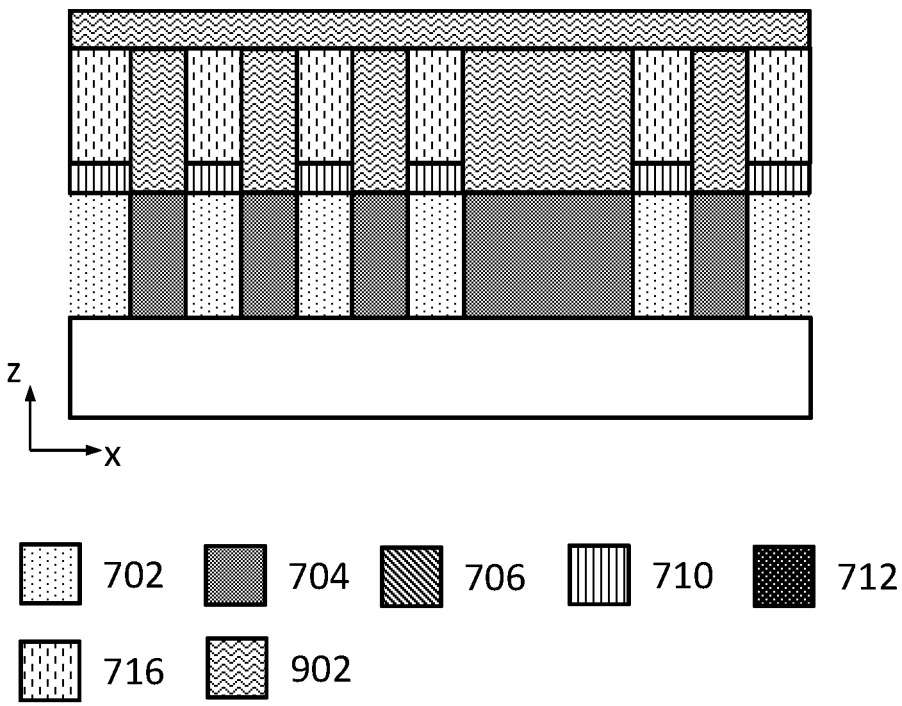

The process 800 proceeds with depositing 806 aSi over the gate, and in particular, into openings created by the process 804. FIG. 9C illustrates an example result of depositing additional aSi 902 into the opening 912 over the gate 732. The full gate length of the gate 732 is now coated by aSi 902. More generally, aSi 902 is deposited over all of the gates 730 and 732 in the gate layer 700.

Figure 9D:
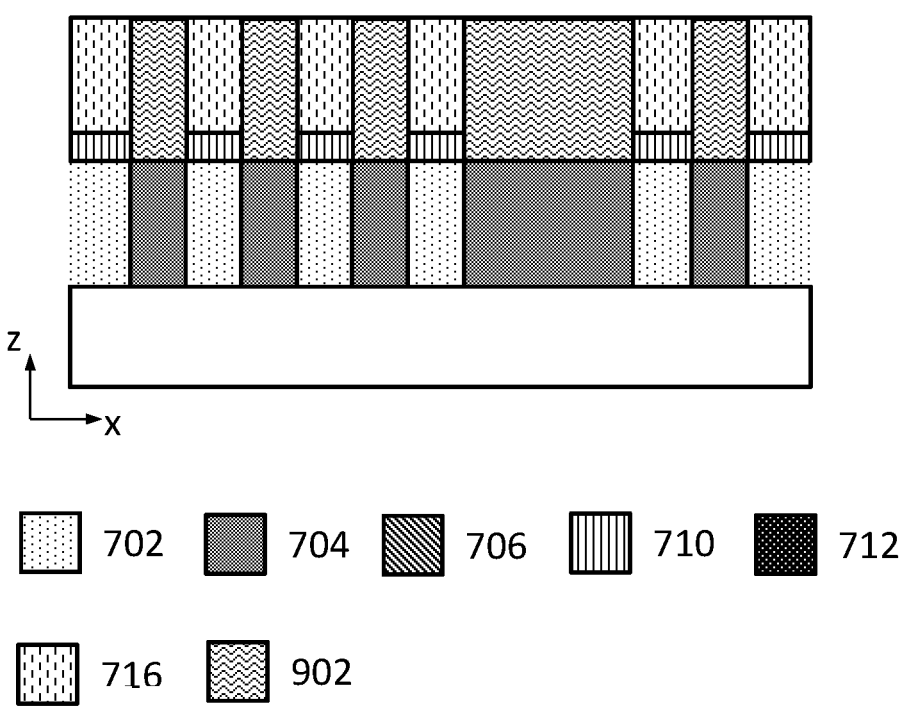

The process 800 proceeds with polishing 808 the top layer of aSi to reveal the self-assembled layer 770. FIG. 9D illustrates an example result of polishing the top layer 910 of aSi 902.

Figure 9E:
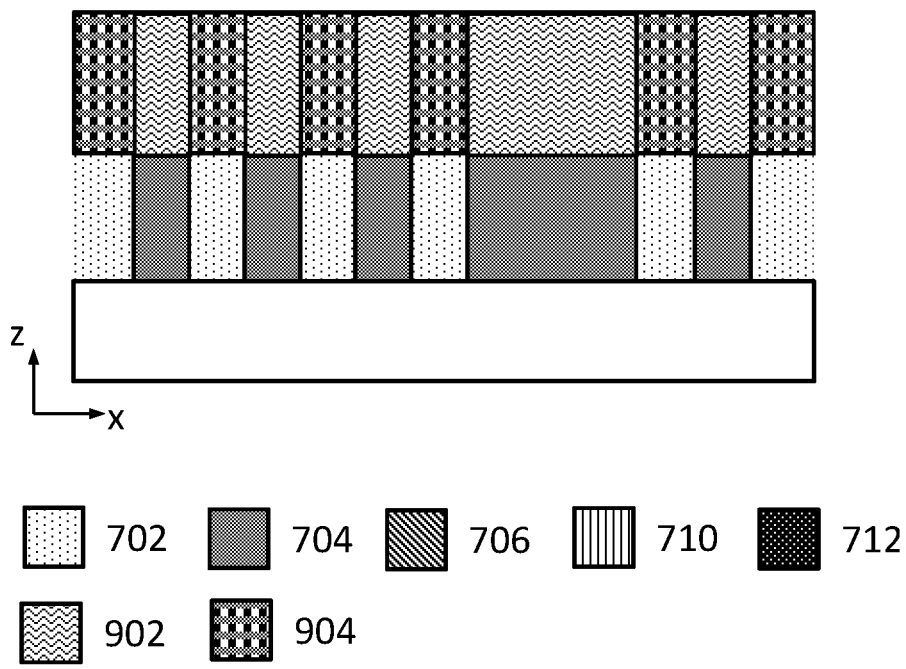

The process 800 proceeds with converting 810 polymer A to a hard mask. FIG. 9E illustrates an example result of converting polymer A 716 to a first hard mask material 904. For example, polymer A 716 is selectively etched, and the first hard mask material 904 is deposited in place of polymer A 716. In other embodiments, rather than etching polymer A 716 and depositing a hard mask material, polymer A 716 may be converted to the first hard mask material 904, e.g., a metal oxide, e.g., by sequential infiltration synthesis, vapor phase infiltration, or liquid phase infiltration.

Figure 9F:
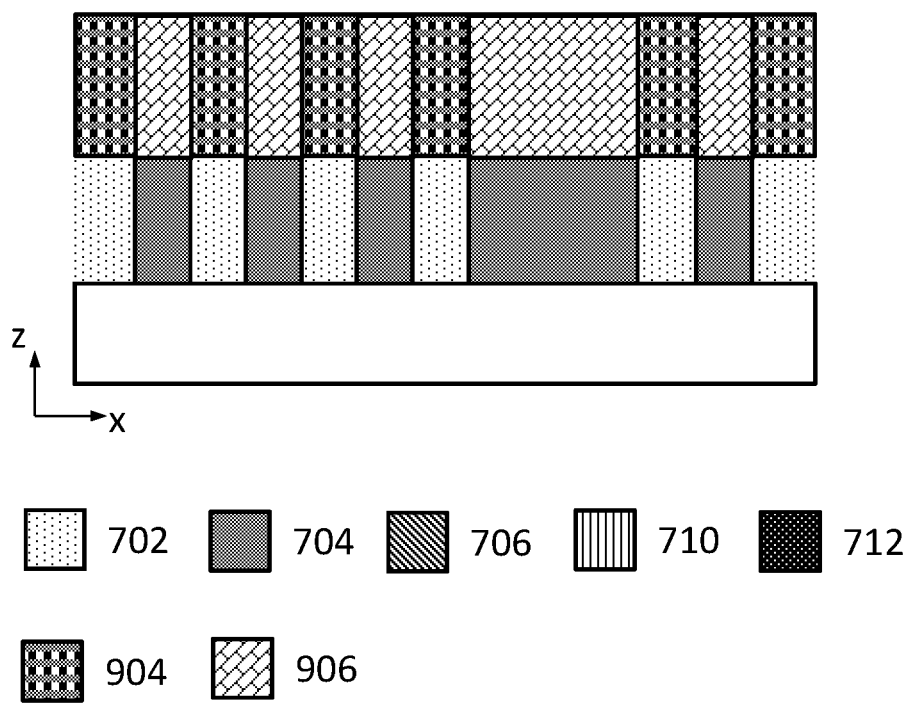

In some embodiments, the process 800 proceeds with removing 812 the aSi and depositing a different hard mask material. FIG. 9F illustrates an example result of removing aSi 902 and depositing a second hard mask material 906. The first hard mask material 904 and second hard mask material 906 may be different hard mask materials with strong etch selectivity, so one or both of the hard masks themselves may be selectively etched. This way, portions of one of the hard mask materials (e.g., portions of the second hard mask material 906 over the gates 730 and 732) may be selectively etched to form contact holes, and vias may be deposited in the contact holes and coupled to gates 730 and/or 732 in the gate layer 700. After polymer A 716 and polymer B 718 have converted to hard masks, the self-assembled layer 770 may be considered a hard mask layer. In some embodiments, the aSi 902 is not replaced with a different material, but is instead left in the hard mask layer.

Additional Features of Patterned Layers Formed Over Non-Uniform Conductive Layers The processes described above for generating patterned layers over non-uniform conductive layers, e.g., non-uniform metal gratings or non-uniform gate layers, using DSA-enabled processes can result in highly regular and well-aligned patterns with tight pitches, as described above. IC devices may exhibit certain physical characteristics in which may indicate that a DSA-enabled process described herein was used, e.g., certain pitches or relationships between different pitches across a particular layer, such as a hard mask layer in which vias may be formed. As another example, IC devices may exhibit differences between a first region in which a DSA-enabled patterning process was performed and a second region in which DSA-enabled patterning process was not performed, which can indicate the use of the DSA-enabled patterning process in the first region.

FIG. 10 illustrates a portion of a patterned layer formed over a metal grating layer using the process described with respect to FIGS. 3 and 4, according to some embodiments of the present disclosure. FIG. 10 illustrates a top-view of a layer 1000 that includes two different hard mask materials 1002 and 1004. The first hard mask material 1002 may be formed over and aligned to insulating portions of a patterned metal layer, which may be similar to the metal grating layer 400. The second hard mask material 1004 may be formed over and aligned to metal portions of a patterned metal layer, e.g., the metal grating layer 400. The first hard mask material 1002 and the second hard mask material 1004 form a hard mask grating, and the layer 1000 may be referred to as a grating layer. The first hard mask material 1002 and the second hard mask material 1004 are arranged at a pitch, which may be the same as the pitch of the underlying metal grating. The pitch of the metal grating and the layer 1000 may be, e.g., less than 30 nanometers, less than 25 nanometers, less than 20 nanometers, or less than 15 nanometers.

The layer 1000 includes a region 1010 in which lines of the second hard mask material 1004 are offset from the lines in the surrounding portion of the layer 1000. The width of the region 1010 may be, e.g., at least three times a pitch of a metal grating in the patterned metal layer below the layer 1000, or at least five times the pitch. The region 1010 may correspond to an insulator region, similar to the insulator regions 413 and 415 illustrated in FIG. 4. In particular, in the patterned metal layer below the layer 1000, a region directly below the region 1010 may not have any metal structures, or may have fewer or sparser metal structures than the surrounding portion of the patterned metal layer. The region 1010 corresponds to a region in which DSA assisting features were used. As described with respect to FIGS. 3 and 4, the DSA assisting features, which are deposited using a lithographic process, may be slightly offset from an underlying metal grating and offset relative to the other surrounding anchoring materials in the guiding pattern. This can result in the offset region 1010 that can be observed in a layer of an IC device.

Lines of the first and second hard mask materials 1002 and 1004 in the region 1010 are offset from lines in the surrounding area by less than their pitch. In some embodiments, the offset amount may be, e.g., less than half of the pitch, or less than a quarter of the pitch. In this example, the offset lines in the region 1010 connect to corresponding lines outside the region 1010, e.g., the line 1012 within the region 1010 is coupled to the line 1014 and the line 1016. A curved transition region, e.g., the transition region 1018, connects the line 1012 to the line 1014.

As discussed above with respect to FIGS. 3 and 4, the layer 1000 may have vias formed therein, and in particular, vias through portions of the second hard mask material 1004 in areas outside the region 1010.

FIG. 11 illustrates a portion of a patterned layer formed over a gate layer using any of the processes described with respect to FIGS. 6-9, according to some embodiments of the present disclosure. FIG. 11 illustrates a top-view of a layer 1100 that includes two different hard mask materials 1102 and 1104. The layer 1100 is formed over a gate layer, e.g., the gate layer 700 described with respect to FIG. 7. The layer 1100 includes a first region 1120 and a second region 1130, with a transition region 1140 between the first region 1120 and the second region 1130.

In the first region 1120, the first hard mask material 1102 may be formed over and aligned to insulating portions of a gate layer, and the second hard mask material 1104 may be formed over and aligned to gate portions of a gate layer, e.g., the gates 730 and 732. The gate layer includes several gates with a gate length 734 (e.g., the gates 730), corresponding to the regions of the second hard mask material 1104 with the width 1110, and a gate with a gate length 736 (e.g., the gate 732), corresponding to the region of the second hard mask material 1104 with the width 1112. The width 1112, and the corresponding gate length 736, may be at least twice the width 1110 and gate length 734, approximately three times the width 1110 and gate length 734, or at least three times the width 1110 and gate length 734.

The second hard mask material 1104 extends across most or all of the underlying gates, covering or substantially covering the gates below the second hard mask material 1104. For example, the width of the second hard mask material 1104 over the gate 732 may be within ±20% of the gate length 736, and the width of the second hard mask material 1106 over the gates 730 may be within ±20% of the gate length 734.

The region 1130 may correspond to an inactive region of the IC device, e.g., a region in which gates (and corresponding transistors or other devices) are not formed. The inactive region may be, e.g., a frame, guard etch, or guard ring. Because the region 1130 does not have underlying gates, a DSA process performed over the region 1130 may be offset or otherwise irregular with respect to the region 1120. In this example, lines of the hard mask materials 1102 and 1104 within the region 1130 are offset relative to corresponding lines within the region 1120. The lines may be offset by, e.g., less than the gate length 734 or width 1110, or less than half the gate length 734 or width 1110. Corresponding lines within the regions 1120 and 1130 may be connected via a transition region 1140.

In this example, the portion 1134 of the second region 1130 extending from the portion of the second hard mask material 1104 with the width 1110 includes two narrower lines of the second hard mask material 1104 separated by a line of the first hard mask material 1102. Because the region 1130 is inactive without underlying gates, the process of removing the polymer formed in the center of the gate and replacing it with the second hard mask material (i.e., either of the processes described with respect to processes 616-620 or 802-806) may not have been performed in the portion 1134.

As discussed above with respect to FIGS. 6-9, the layer 1100 may have vias formed therein, and in particular, vias through portions of the second hard mask material 1104 in the region 1120.

The region 1130 provides one example pattern that may be observed in an area outside an active region, e.g., outside a region in which gates are present. In other examples, inactive areas of an IC device may have different patterns resulting from a less controlled DSA procedure performed in such regions. For example, instead of the region 1130 shown in FIG. 11, an area with the flipped morphology illustrated in FIG. 5 may be present.

As another example, a fingerprint pattern may be present in an inactive region of the IC device, such as a frame, guard etch, or guard ring. FIG. 12 illustrates a portion of a patterned layer generated using any of the processes described herein, according to some embodiments of the present disclosure. FIG. 12 depicts a first region 1210, e.g., an active region, having a regular and well-aligned grating pattern that extends horizontally, e.g., in the x-direction. FIG. 12 also depicts a second region 1212, e.g., an inactive region, bounded by a dashed box. Lines in the second region 1212 exhibit a fingerprint pattern, i.e., a pattern of alternating metal and insulator regions that has a higher degree of irregularity and lack of directionality across the pattern. The fingerprint pattern may resemble types of physical structures observed in humans' fingerprints.

Example Electronic Devices

Layers of cylindrical via structures in a hexagonal array formed using the guided hexagonal array process described herein may be included in any suitable electronic device. FIGS. 13-16 illustrate various examples of devices and components that may include cylindrical structures, e.g., vias, deposited in a hexagonal array as described herein.

Figure 13A:
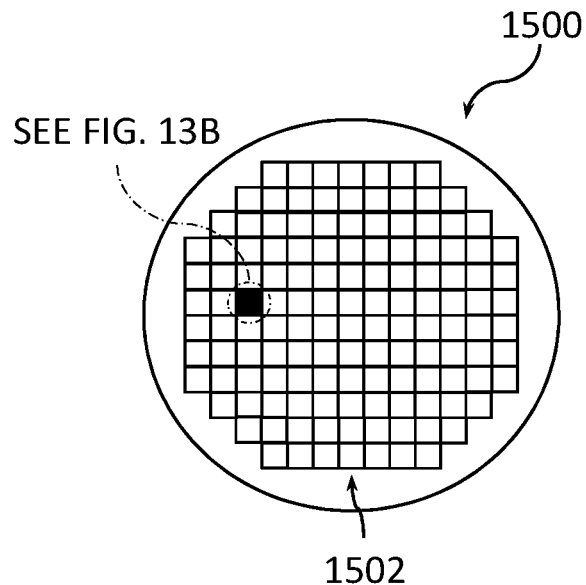
FIGS. 13A and 13B are top views of, respectively, a wafer and dies that may include a patterned layer over a metal grating or a gate layer in accordance with any of the embodiments disclosed herein.
Figure 13B:
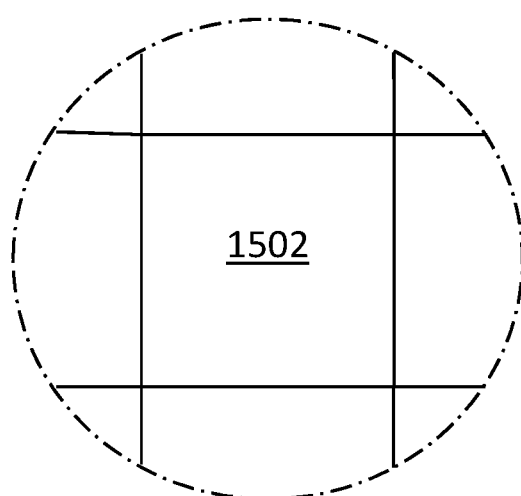

FIGS. 13A and 13B are top views of a wafer and dies that include one or more IC structures with devices including a patterned layer over a metal grating or a gate layer in accordance with any of the embodiments disclosed herein. The wafer 1500 may be composed of semiconductor material and may include one or more dies 1502 having IC structures formed on a surface of the wafer 1500. Each of the dies 1502 may be a repeating unit of a semiconductor product that includes any suitable IC structure (e.g., the IC structures as shown in any of FIGS. 1, 2, or 4-6, or any further embodiments of the IC structures described herein). After the fabrication of the semiconductor product is complete (e.g., after manufacture of one or more IC structures with one or more devices including a patterned layer over a metal grating or a gate layer as described herein, included in a particular electronic component, e.g., in a transistor or in a memory device), the wafer 1500 may undergo a singulation process in which each of the dies 1502 is separated from one another to provide discrete "chips" of the semiconductor product. In particular, devices that include one or more devices that include a patterned layer over a metal grating or a gate layer as disclosed herein may take the form of the wafer 1500 (e.g., not singulated) or the form of the die 1502 (e.g., singulated). The die 1502 may include one or more transistors (e.g., one or more of the transistors 1640 of FIG. 14, discussed below) and/or supporting circuitry to route electrical signals to the transistors, as well as any other IC components (e.g., one or more devices that include a patterned layer over a metal grating or a gate layer). In some embodiments, the wafer 1500 or the die 1502 may include a memory device (e.g., an SRAM device), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 16) or other logic that is configured to store information in the memory devices or execute instructions stored in the memory array.

Figure 14:
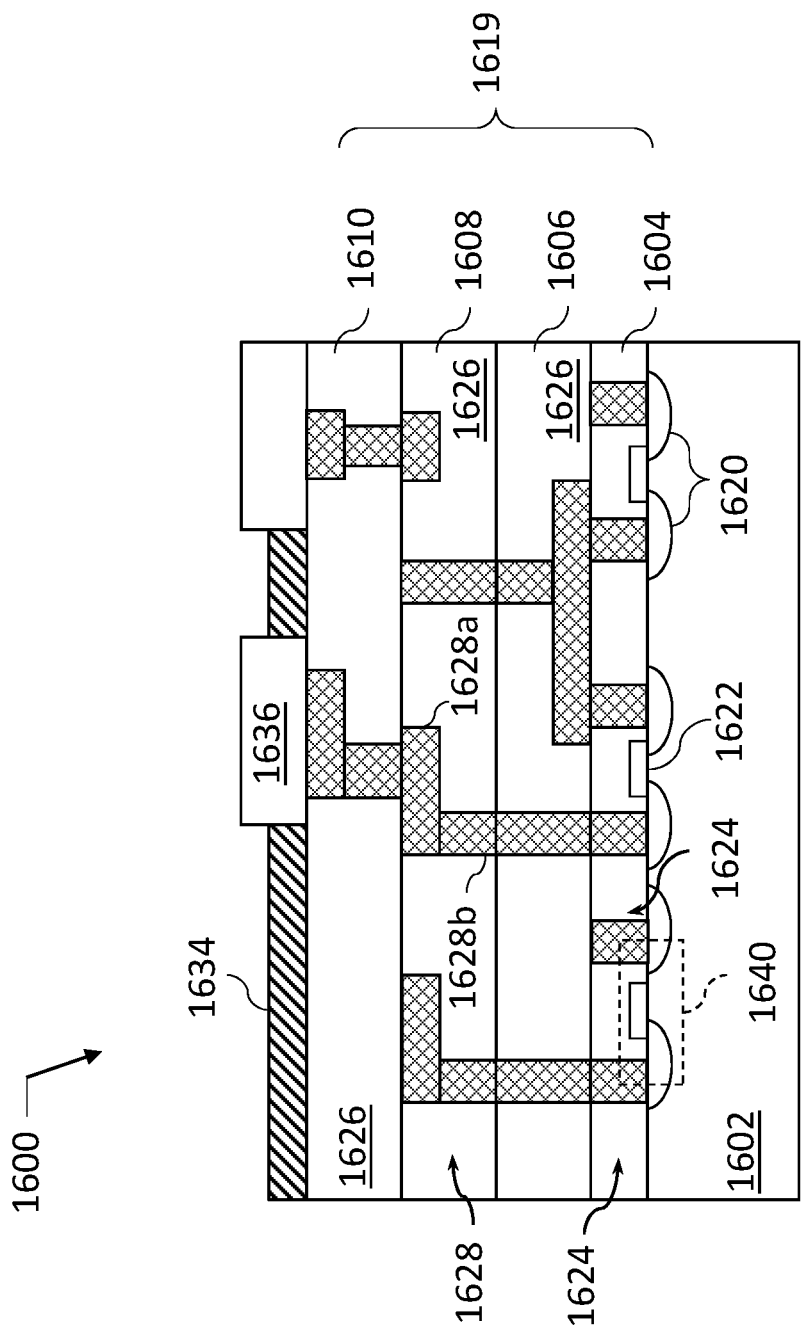
FIG. 14 is a cross-sectional side view of an IC package that may include a patterned layer over a metal grating or a gate layer in accordance with any of the embodiments disclosed herein.

FIG. 14 is a cross-sectional side view of an IC device 1600 that may include one or more devices including a patterned layer over a metal grating or a gate layer in accordance with any of the embodiments disclosed herein. The IC device 1600 may be formed on a substrate 1602 (e.g., the wafer 1500 of FIG. 13A) and may be included in a die (e.g., the die 1502 of FIG. 13B). The substrate 1602 may be any substrate as described herein. The substrate 1602 may be part of a singulated die (e.g., the dies 1502 of FIG. 13B) or a wafer (e.g., the wafer 1500 of FIG. 13A).

The IC device 1600 may include one or more device layers 1604 disposed on the substrate 1602. The device layer 1604 may include features of one or more transistors 1640 (e.g., metal oxide semiconductor field-effect transistors (MOSFETs)) formed on the substrate 1602. The device layer 1604 may include, for example, one or more source and/or drain (S/D) regions 1620, a gate 1622 to control current flow in the transistors 1640 between the S/D regions 1620, and one or more S/D contacts 1624 to route electrical signals to/from the S/D regions 1620. The transistors 1640 may include additional features not depicted for the sake of clarity, such as device isolation regions, gate contacts, and the like. The transistors 1640 are not limited to the type and configuration depicted in FIG. 14 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon and nanowire transistors.

Each transistor 1640 may include a gate 1622 formed of at least two layers, a gate electrode layer and a gate dielectric layer.

The gate electrode layer may be formed on the gate interconnect support layer and may consist of at least one P-type workfunction metal or N-type workfunction metal, depending on whether the transistor is to be a PMOS or an NMOS transistor, respectively. In some implementations, the gate electrode layer may consist of a stack of two or more metal layers, where one or more metal layers are workfunction metal layers and at least one metal layer is a fill metal layer. Further metal layers may be included for other purposes, such as a barrier layer or/and an adhesion layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 electron Volts (eV) and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, aluminum carbide, tungsten, tungsten carbide. An N-type metal layer will enable the formation of an NMOS gate electrode with a workfunction that is between about 3.9 eV and about 4.2 eV.

In some embodiments, when viewed as a cross section of the transistor 1640 along the source-channel-drain direction, the gate electrode may be formed as a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may be implemented as a combination of U-shaped structures and planar, non-U-shaped structures. For example, the gate electrode may be implemented as one or more U-shaped metal layers formed atop one or more planar, non-U-shaped layers. In some embodiments, the gate electrode may consist of a V-shaped structure (e.g., when a fin of a FinFET transistor does not have a "flat" upper surface, but instead has a rounded peak).

Generally, the gate dielectric layer of a transistor 1640 may include one layer or a stack of layers, and the one or more layers may include silicon oxide, silicon dioxide, and/or a high-k dielectric material. The high-k dielectric material included in the gate dielectric layer of the transistor 1640 may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The S/D regions 1620 may be formed within the substrate 1602 adjacent to the gate 1622 of each transistor 1640, using any suitable processes known in the art. For example, the S/D regions 1620 may be formed using either an implantation/diffusion process or a deposition process. In the former process, dopants such as boron, aluminum, antimony, phosphorous, or arsenic may be ion-implanted into the substrate 1602 to form the S/D regions 1620. An annealing process that activates the dopants and causes them to diffuse farther into the substrate 1602 may follow the ion implantation process. In the latter process, an epitaxial deposition process may provide material that is used to fabricate the S/D regions 1620. In some implementations, the S/D regions 1620 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1620 may be formed using one or more alternate semiconductor materials such as germanium or a group III-V material or alloy. In further embodiments, one or more layers of metal and/or metal alloys may be used to form the S/D regions 1620. In some embodiments, an etch process may be performed before the epitaxial deposition to create recesses in the substrate 1602 in which the material for the S/D regions 1620 is deposited.

Electrical signals, such as power and/or input/output (I/O) signals, may be routed to and/or from the transistors 1640 of the device layer 1604 through one or more interconnect layers disposed on the device layer 1604 (illustrated in FIG. 14 as interconnect layers 1606-1610). For example, electrically conductive features of the device layer 1604 (e.g., the gate 1622 and the S/D contacts 1624) may be electrically coupled with the interconnect structures 1628 of the interconnect layers 1606-1610. The one or more interconnect layers 1606-1610 may form an ILD stack 1619 of the IC device 1600.

The interconnect structures 1628 may be arranged within the interconnect layers 1606-1610 to route electrical signals according to a wide variety of designs (in particular, the arrangement is not limited to the particular configuration of interconnect structures 1628 depicted in FIG. 14). Although a particular number of interconnect layers 1606-1610 is depicted in FIG. 14, embodiments of the present disclosure include IC devices having more or fewer interconnect layers than depicted.

In some embodiments, the interconnect structures 1628 may include trench contact structures 1628a (sometimes referred to as "lines") and/or via structures 1628b (sometimes referred to as "holes") filled with an electrically conductive material such as a metal. The trench contact structures 1628a may be arranged to route electrical signals in a direction of a plane that is substantially parallel with a surface of the substrate 1602 upon which the device layer 1604 is formed. For example, the trench contact structures 1628a may route electrical signals in a direction in and out of the page from the perspective of FIG. 14. The via structures 1628b may be arranged to route electrical signals in a direction of a plane that is substantially perpendicular to the surface of the substrate 1602 upon which the device layer 1604 is formed. In some embodiments, the via structures 1628b may electrically couple trench contact structures 1628a of different interconnect layers 1606-1610 together.

The interconnect layers 1606-1610 may include a dielectric material 1626 disposed between the interconnect structures 1628, as shown in FIG. 14. The dielectric material 1626 may take the form of any of the embodiments of the dielectric material provided between the interconnects of the IC structures disclosed herein.

In some embodiments, the dielectric material 1626 disposed between the interconnect structures 1628 in different ones of the interconnect layers 1606-1610 may have different compositions. In other embodiments, the composition of the dielectric material 1626 between different interconnect layers 1606-1610 may be the same.

A first interconnect layer 1606 (referred to as Metal 1 or "M1") may be formed directly on the device layer 1604. In some embodiments, the first interconnect layer 1606 may include trench contact structures 1628a and/or via structures 1628b, as shown. The trench contact structures 1628a of the first interconnect layer 1606 may be coupled with contacts (e.g., the S/D contacts 1624) of the device layer 1604.

A second interconnect layer 1608 (referred to as Metal 2 or "M2") may be formed directly on the first interconnect layer 1606. In some embodiments, the second interconnect layer 1608 may include via structures 1628b to couple the trench contact structures 1628a of the second interconnect layer 1608 with the trench contact structures 1628a of the first interconnect layer 1606. Although the trench contact structures 1628a and the via structures 1628b are structurally delineated with a line within each interconnect layer (e.g., within the second interconnect layer 1608) for the sake of clarity, the trench contact structures 1628*a* and the via structures 1628*b* may be structurally and/or materially contiguous (e.g., simultaneously filled during a dual-damascene process) in some embodiments.

A third interconnect layer 1610 (referred to as Metal 3 or "M3") (and additional interconnect layers, as desired) may be formed in succession on the second interconnect layer 1608 according to similar techniques and configurations described in connection with the second interconnect layer 1608 or the first interconnect layer 1606.

The IC device 1600 may include a solder resist material 1634 (e.g., polyimide or similar material) and one or more bond pads 1636 formed on the interconnect layers 1606-1610. The bond pads 1636 may be electrically coupled with the interconnect structures 1628 and configured to route the electrical signals of the transistor(s) 1640 to other external devices. For example, solder bonds may be formed on the one or more bond pads 1636 to mechanically and/or electrically couple a chip including the IC device 1600 with another component (e.g., a circuit board). The IC device 1600 may have other alternative configurations to route the electrical signals from the interconnect layers 1606-1610 than depicted in other embodiments. For example, the bond pads 1636 may be replaced by or may further include other analogous features (e.g., posts) that route the electrical signals to external components.

Figure 15:
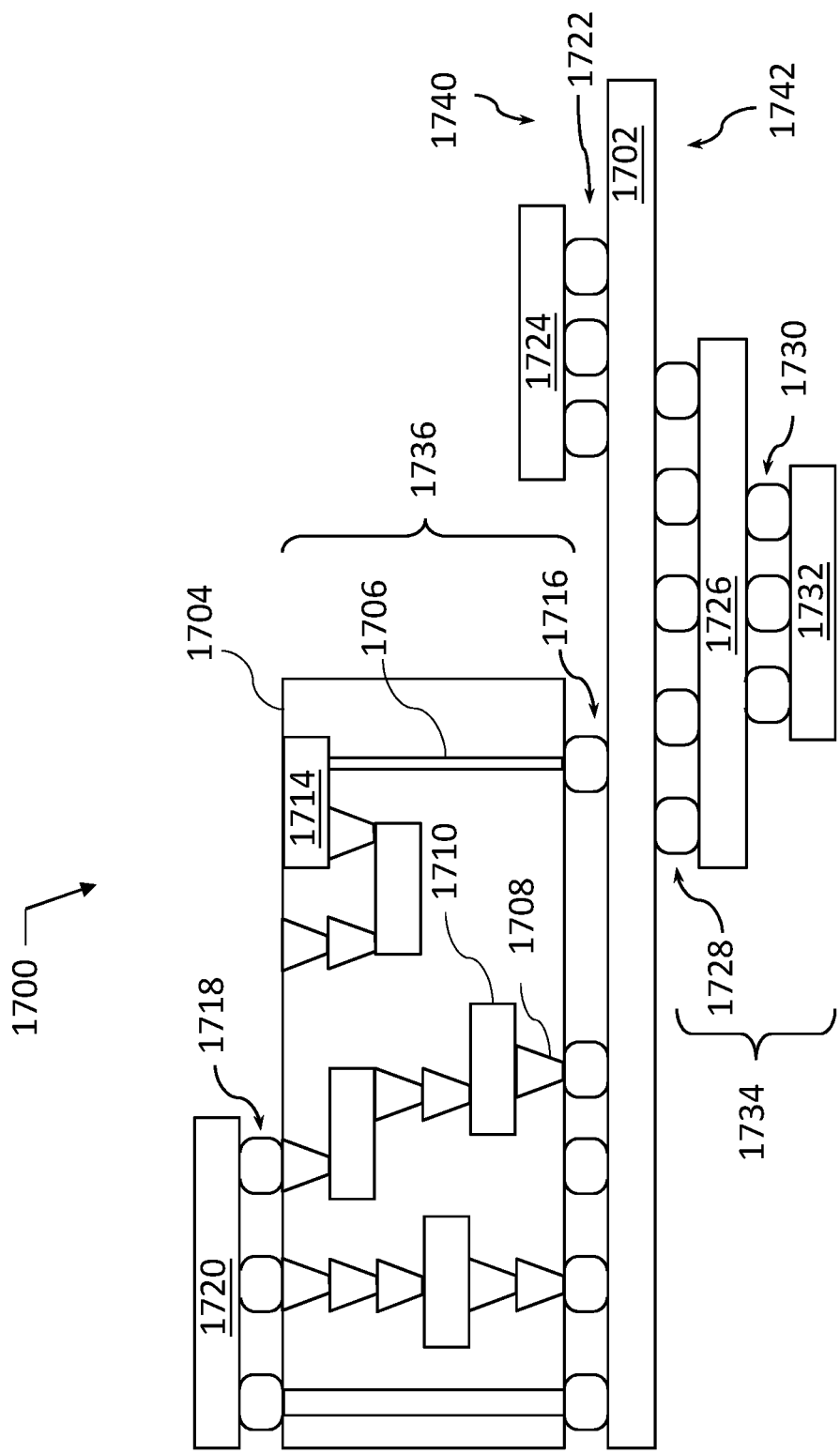
FIG. 15 is a cross-sectional side view of an IC device assembly that may include a patterned layer over a metal grating or a gate layer in accordance with any of the embodiments disclosed herein.

FIG. 15 is a cross-sectional side view of an IC device assembly 1700 that may include components having or being associated with (e.g., being electrically connected by means of) one or more devices including a patterned layer over a metal grating or a gate layer accordance with any of the embodiments disclosed herein. The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742. In particular, any suitable ones of the components of the IC device assembly 1700 may include any of the patterned layers over metal gratings and/or gate layers as disclosed herein.

In some embodiments, the circuit board 1702 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC device assembly 1700 illustrated in FIG. 15 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702 and may include solder balls (as shown in FIG. 15), male and female portions of a socket, an adhesive, an underfill material, and/or any other suitable electrical and/or mechanical coupling structure.

The package-on-interposer structure 1736 may include an IC package 1720 coupled to an interposer 1704 by coupling components 1718. The coupling components 1718 may take any suitable form for the application, such as the forms discussed above with reference to the coupling components 1716. Although a single IC package 1720 is shown in FIG. 15, multiple IC packages may be coupled to the interposer 1704; indeed, additional interposers may be coupled to the interposer 1704. The interposer 1704 may provide an intervening substrate used to bridge the circuit board 1702 and the IC package 1720. The IC package 1720 may be or include, for example, a die (the die 1502 of FIG. 13B), an IC device (e.g., the IC device 1600 of FIG. 14), or any other suitable component. In some embodiments, the IC package 1720 may include a patterned layer over a metal grating or a gate layer, as described herein. Generally, the interposer 1704 may spread a connection to a wider pitch or reroute a connection to a different connection. For example, the interposer 1704 may couple the IC package 1720 (e.g., a die) to a ball grid array (BGA) of the coupling components 1716 for coupling to the circuit board 1702. In the embodiment illustrated in FIG. 15, the IC package 1720 and the circuit board 1702 are attached to opposing sides of the interposer 1704; in other embodiments, the IC package 1720 and the circuit board 1702 may be attached to a same side of the interposer 1704. In some embodiments, three or more components may be interconnected by way of the interposer 1704.

The interposer 1704 may be formed of an epoxy resin, a fiberglass-reinforced epoxy resin, a ceramic material, or a polymer material such as polyimide. In some implementations, the interposer 1704 may be formed of alternate rigid or flexible materials that may include the same materials described above for use in a semiconductor substrate, such as silicon, germanium, and other group III-V and group IV materials. The interposer 1704 may include metal interconnects 1708 and vias 1710, including but not limited to TSVs 1706. The interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency (RF) devices, power amplifiers, power management devices, antennas, arrays, sensors, and microelectromechanical systems (MEMS) devices may also be formed on the interposer 1704. The package-on-interposer structure 1736 may take the form of any of the package-on-interposer structures known in the art.

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 15 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 16:
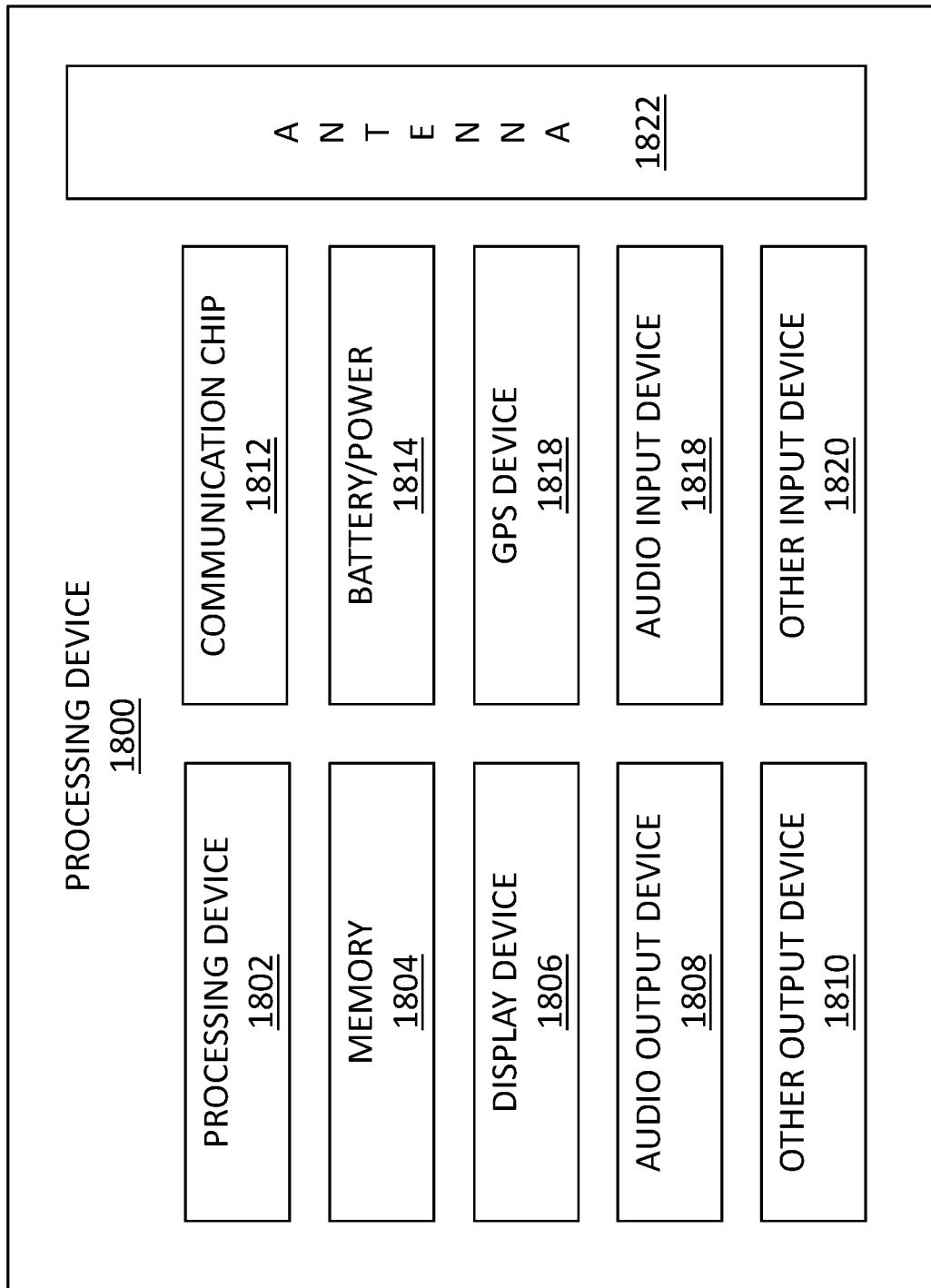
FIG. 16 is a block diagram of an example computing device that may include a patterned layer over a metal grating or a gate layer in accordance with any of the embodiments disclosed herein.

FIG. 16 is a block diagram of an example computing device 1800 that may include one or more components including one or more devices including a patterned layer over a metal grating or a gate layer in accordance with any of the embodiments disclosed herein. For example, any suitable ones of the components of the computing device 1800 may include a die (e.g., the die 1502 of FIG. 13B) having a patterned layer over a metal grating or a gate layer as described herein. Any one or more of the components of the computing device 1800 may include, or be included in, an IC device 1600 (FIG. 14). Any one or more of the components of the computing device 1800 may include, or be included in, an IC device assembly 1700 (FIG. 15).

A number of components are illustrated in FIG. 16 as included in the computing device 1800, but any one or more of these components may be omitted or duplicated, as suitable for the application. In some embodiments, some or all of the components included in the computing device 1800 may be attached to one or more motherboards. In some embodiments, some or all of these components are fabricated onto a single system-on-a-chip (SoC) die.

Additionally, in various embodiments, the computing device 1800 may not include one or more of the components illustrated in FIG. 16, but the computing device 1800 may include interface circuitry for coupling to the one or more components. For example, the computing device 1800 may not include a display device 1806, but may include display device interface circuitry (e.g., a connector and driver circuitry) to which a display device 1806 may be coupled. In another set of examples, the computing device 1800 may not include an audio input device 1824 or an audio output device 1808 but may include audio input or output device interface circuitry (e.g., connectors and supporting circuitry) to which an audio input device 1824 or audio output device 1808 may be coupled.

The computing device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The computing device 1800 may include a memory 1804, which may itself include one or more memory devices such as volatile memory (e.g., dynamic random-access memory (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic random-access memory (eDRAM) or spin transfer torque magnetic random-access memory (STT-MRAM).

In some embodiments, the computing device 1800 may include a communication chip 1812 (e.g., one or more communication chips). For example, the communication chip 1812 may be configured for managing wireless communications for the transfer of data to and from the computing device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High-Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The computing device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The computing device 1800 may include battery/power circuitry 1814. The battery/power circuitry 1814 may include one or more energy storage devices (e.g., batteries or capacitors) and/or circuitry for coupling components of the computing device 1800 to an energy source separate from the computing device 1800 (e.g., AC line power).

The computing device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display, for example.

The computing device 1800 may include an audio output device 1808 (or corresponding interface circuitry, as discussed above). The audio output device 1808 may include any device that generates an audible indicator, such as speakers, headsets, or earbuds, for example.

The computing device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The computing device 1800 may include a GPS device 1818 (or corresponding interface circuitry, as discussed above). The GPS device 1818 may be in communication with a satellite-based system and may receive a location of the computing device 1800, as known in the art.

The computing device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The computing device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 1800 may have any desired form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 1800 may be any other electronic device that processes data.

SELECT EXAMPLES

The following paragraphs provide various examples of the embodiments disclosed herein.

Example 1 provides an IC device including a first grating layer including a plurality of metal lines separated by a plurality of insulator lines, the metal lines having a pitch, the metal grating further including an insulator region having a width of at least three times the pitch; and a second grating layer over the first grating layer, the second grating layer including a plurality of lines of a first material separated by a plurality of lines of a second material, the first material having the pitch, the second grating layer including a first region formed over the insulator region of the first grating layer, and a second region, where a line of the first material in the first region is offset from a line of the first material in the second region by less than the pitch.

Example 2 provides the IC device of example 1, where the line of the first material in the first region is coupled to the line of the first material in the second region.

Example 3 provides the IC device of example 1 or 2, where, in the second region of the second grating layer a line of the first material is aligned over a corresponding metal line in the first grating layer; and a line of the second material is aligned over a corresponding insulator line in the first grating layer.

Example 4 provides the IC device of example 3, further including a via formed through the line of the first material, the via coupled to the corresponding metal line in the first grating layer.

Example 5 provides the IC device of any of the preceding examples, where the pitch is less than 30 nanometers.

Example 6 provides the IC device of any of the preceding examples, where the width of the insulator region is at least five times the pitch.

Example 7 provides the IC device of any of the preceding examples, where the line of the first material in the first region is offset from a line of the first material in the second region by less than half the pitch.

Example 8 provides the IC device of any of the preceding examples, where the second grating layer further includes a third region, and lines of the first material in the third region form a fingerprint pattern.

Example 9 provides the IC device of any of the preceding examples, where the first material and the second material are insulators.

Example 10 provides a method for forming a grating pattern, the method including depositing a DSA assisting feature over an insulator region of a metal grating, the metal grating including a plurality of metal lines separated by a plurality of insulator lines, the metal lines having a pitch, the insulator region having a width of at least three times the pitch; depositing a guiding pattern over the metal grating, the guiding pattern including an anchoring material covering at least a subset of the metal lines; and forming a polymer layer over the metal grating, the polymer layer including a first polymer and a second polymer, where the second polymer is formed over the anchoring material and the DSA assisting feature, the polymer layer arranged by DSA.

Example 11 provides the method of example 10, where depositing the DSA assisting feature includes depositing a DSA assist material over the metal grating; depositing a mask over the DSA assist material; patterning the mask based on a pattern for the DSA assisting feature; and removing a portion of the DSA assist material exposed by the patterned mask.

Example 12 provides the method of example 10 or 11, where the DSA assisting feature has an affinity to the second polymer.

Example 13 provides the method of any of examples 10 through 12, where the guiding pattern further includes a second anchoring material deposited over at least a subset of the plurality of insulator lines.

Example 14 provides the method of any of examples 10 through 13, where forming the polymer layer includes depositing a diblock copolymer including the first polymer and the second polymer over the DSA assisting feature and the guiding pattern; and annealing the diblock copolymer to form regions of the first polymer over the anchoring material and the DSA assisting feature, where the first polymer is formed over at least a subset of the plurality of insulator lines.

Example 15 provides the method of any of examples 10 through 14, further including removing the second polymer;

and depositing a hard mask material over regions of the metal grating exposed by removing the second polymer.

Example 16 provides the method of example 15, further including removing the first polymer; and depositing a second hard mask material over regions of the metal grating exposed by removing the first polymer.

Example 17 provides the method of example 15 or 16, further including etching a portion of the hard mask material; and depositing a via in the etched portion of the hard mask material, the via coupled to a metal line under the hard mask material.

Example 18 provides an IC device including a first layer including a first gate line and a second gate line separated by an insulator, the first gate line having a first gate length, and the second gate line having a second gate length at least twice the first gate length; and a second layer formed over the first layer, the second layer including a first region of a first material formed over the first gate line, a second region of the first material formed over the second gate line, and a third region coupled to the first region, the third region offset from the first region by less than the first gate length.

Example 19 provides the IC device of example 18, where the first region is coupled to the third region.

Example 20 provides the IC device of example 18 or 19, where the third region is formed over a region of the first layer in which gates is not formed.

Example 21 provides the IC device of any of examples 18 through 20, where the first region has a first width, the first width within ±20% of the first gate length, and the second region has a second width, the second width within ±20% of the second gate length.

Example 22 provides the IC device of any of examples 18 through 21, further including a via formed through first region of the first material, the via coupled to the first gate line.

Example 23 provides the IC device of any of examples 18 through 22, the second layer further including a fourth region coupled to the second region, the fourth region offset from the second region by less than the first gate length, where the fourth region includes two lines of the first material separated by a second material.

Example 24 provides the IC device of any of examples 18 through 22, the second layer further including a fourth region coupled to the second region, the fourth region including a second material different from the first material.

Example 25 provides the IC device of any of examples 18 through 24, where the third region is offset from the first region by less than half the first gate length.

Example 26 provides the IC device of any of examples 18 through 25, where the second layer further includes a fourth region of the first material, the fourth region arranged in a fingerprint pattern.

Example 27 provides the IC device of any of examples 18 through 26, where the first material is an insulator.

Example 28 provides the IC device of any of examples 18 through 27, where the second gate length is at least three times the first gate length.

Example 29 provides a method for forming a pattern replicating a gate layer, the method including depositing a DSA assisting feature over a portion of first gate line in a gate layer, the first gate having a first gate length, the gate layer further including a second gate line separated from the first gate line by an insulator, the second gate line having a second gate length, where the first gate length is at least twice the second gate length; depositing a guiding pattern over the gate layer, the guiding pattern including an anchoring material formed over the second gate line and a second portion of the first gate line; and forming a polymer layer over the gate layer, the polymer layer including a first polymer and a second polymer, where the first polymer is formed over the anchoring material and the second polymer is formed over the DSA assisting feature, the polymer layer arranged by DSA.

Example 30 provides the method of example 29, where depositing the DSA assisting feature includes depositing a DSA assist material over the gate layer; depositing a mask over the DSA assist material; patterning the mask based on a pattern for the DSA assisting feature; and removing a portion of the DSA assist material exposed by the patterned mask.

Example 31 provides the method of example 29 or 30, where the DSA assisting feature where the DSA assisting feature has an affinity to the second polymer.

Example 32 provides the method of any of examples 29 through 31, where the guiding pattern further includes a second anchoring material deposited over formed over the insulator.

Example 33 provides the method of any of examples 29 through 32, where forming the polymer layer includes depositing a diblock copolymer including the first polymer and the second polymer over the DSA assisting feature and the guiding pattern; and annealing the diblock copolymer to form regions of the first polymer over the anchoring material and regions of the second polymer over the DSA assisting feature.

Example 34 provides the method of any of examples 29 through 33, further including removing the second polymer; and depositing a hard mask material over regions of the gate layer exposed by removing the second polymer.

Example 35 provides the method of example 34, further including removing the first polymer; and depositing a second hard mask material over regions of the metal grating exposed by removing the first polymer.

Example 36 provides the method of example 34 or 35, further including etching a portion of the hard mask material; and depositing a via in the etched portion of the hard mask material, the via coupled to a gate line under the hard mask material.

Example 37 provides an IC package that includes an IC die, including one or more of the memory/IC devices according to any one of the preceding examples. The IC package may also include a further component, coupled to the IC die.

Example 38 provides the IC package according to example 37, where the further component is one of a package substrate, a flexible substrate, or an interposer.

Example 39 provides the IC package according to examples 37 or 38, where the further component is coupled to the IC die via one or more first level interconnects.

Example 40 provides the IC package according to example 39, where the one or more first level interconnects include one or more solder bumps, solder posts, or bond wires.

Example 41 provides a computing device that includes a circuit board; and an IC die coupled to the circuit board, where the IC die includes one or more of the memory/IC devices according to any one of the preceding examples (e.g., memory/IC devices according to any one of examples 1-36), and/or the IC die is included in the IC package according to any one of the preceding examples (e.g., the IC package according to any one of examples 37-40).

Example 42 provides the computing device according to example 41, where the computing device is a wearable computing device (e.g., a smart watch) or handheld computing device (e.g., a mobile phone).

Example 43 provides the computing device according to examples 41 or 42, where the computing device is a server processor.

Example 44 provides the computing device according to examples 41 or 42, where the computing device is a motherboard.

Example 45 provides the computing device according to any one of examples 41-44, where the computing device further includes one or more communication chips and an antenna.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:

1. An integrated circuit (IC) device comprising:
   a first grating layer comprising a plurality of metal lines separated by a plurality of insulator lines, the metal lines having a pitch, the first grating layer further comprising, in a same plane as the plurality of metal lines and the plurality of insulator lines, an insulator region having a width of at least three times the pitch; and
   a second grating layer over the first grating layer, the second grating layer comprising a plurality of lines of a first material separated by a plurality of lines of a second material, adjacent lines of the first material arranged at the pitch, the second grating layer comprising:
      a first region formed over the insulator region of the first grating layer; and
      a second region, wherein a line of the first material in the first region is offset from a line of the first material in the second region, and an amount of the offset is greater than zero and less than the pitch.

2. The IC device of claim 1, wherein the line of the first material in the first region is coupled to the line of the first material in the second region.

3. The IC device of claim 1, wherein, in the second region of the second grating layer:
   a line of the first material is aligned over a corresponding metal line in the first grating layer; and
   a line of the second material is aligned over a corresponding insulator line in the first grating layer.

4. The IC device of claim 3, further comprising a via formed through the line of the first material, the via coupled to the corresponding metal line in the first grating layer.

5. The IC device of claim 1, wherein the pitch is less than 30 nanometers.

6. The IC device of claim 1, wherein the width of the insulator region is at least five times the pitch.

7. The IC device of claim 1, wherein the line of the first material in the first region is offset from a line of the first material in the second region by less than half the pitch.

8. The IC device of claim 1, wherein the second grating layer further comprises a third region, and lines of the first material in the third region form a fingerprint pattern.

9. The IC device of claim 1, wherein the first material and the second material are insulators.

10. An system comprising:
    a packaging component; and
    a device coupled to the packaging component, the device comprising:
       a first layer comprising:
          metal lines separated by insulator lines, the metal lines arranged at a pitch; and
          an insulator region in a same plane as the metal lines and the insulator lines, the insulator region having a width of at least three times the pitch; and
       a second layer over the first layer, the second layer comprising a plurality of lines of a first material separated by a plurality of lines of a second material, adjacent lines of the first material arranged at the pitch, the second layer comprising:
          a first region formed over the insulator region of the first layer; and
          a second region, wherein a line of the first material in the first region is offset from a line of the first material in the second region, and an amount of the offset is greater than zero and less than the pitch.

11. The system of claim 10, wherein the line of the first material in the first region is coupled to the line of the first material in the second region.

12. The system of claim 10, wherein, in the second region of the second layer:
    a line of the first material is aligned over a corresponding metal line in the first layer; and
    a line of the second material is aligned over a corresponding insulator line in the first layer.

13. The system of claim 12, further comprising a via formed through the line of the first material, the via coupled to the corresponding metal line in the first layer.

14. The system of claim 10, wherein the pitch is less than 30 nanometers.

15. The system of claim 10, wherein the line of the first material in the first region is offset from a line of the first material in the second region by less than half the pitch.

16. The system of claim 10, wherein the second layer further comprises a third region, and lines of the first material in the third region form a fingerprint pattern.

17. A device comprising:
    a first region having a first plurality of lines of a first insulator material separated by a second plurality of lines of a second insulator material, wherein adjacent lines of the first insulator material are arranged at a pitch;
    a second region having a third plurality of lines of the first insulator material and a fourth plurality of lines of the second insulator material, wherein a first line of the first plurality of lines is connected to a second line of the third plurality of lines, and the first line and second line are offset, and an amount of the offset is greater than zero and less than the pitch; and
    a third region having a fifth plurality of lines of the first insulator material and a sixth plurality of lines of the second insulator material, wherein the second region is between the first region and the third region, a third line of the fifth plurality of lines is connected to the second line, and the first line is not offset from the third line.

18. The device of claim 17, wherein the first line and the second line are connected at a curved transition region.

19. The device of claim 17, further comprising a metal via formed through the first line.

20. The device of claim 17, wherein a plurality of vias are formed in the first region, and vias are not formed in the second region.

* * * * *